(12) United States Patent
Kvatinsky et al.

(10) Patent No.: US 9,548,741 B1
(45) Date of Patent: Jan. 17, 2017

(54) MEMRISTIVE AKERS LOGIC ARRAY

(71) Applicant: Technion Research and Development Foundation LTD., Haifa (IL)

(72) Inventors: Shahar Kvatinsky, Ramat Gan (IL); Avinoam Kolodny, Haifa (IL); Yifat Hanein, Kfar Saba (IL)

(73) Assignee: TECHNION RESEARCH AND DEVELOPMENT FOUNDATION LTD., Haifa (IL)

( * ) Notice: Subject to any disclaimer, the term of this patent is extended or adjusted under 35 U.S.C. 154(b) by 0 days.

(21) Appl. No.: 14/798,485

(22) Filed: Jul. 14, 2015

(51) Int. Cl.
*H03K 19/173* (2006.01)
*H03K 19/177* (2006.01)
*H03K 19/02* (2006.01)
*H03K 19/094* (2006.01)

(52) U.S. Cl.
CPC .......... *H03K 19/1776* (2013.01); *H03K 19/02* (2013.01); *H03K 19/094* (2013.01); *H03K 19/17708* (2013.01)

(58) Field of Classification Search
None
See application file for complete search history.

(56) References Cited

U.S. PATENT DOCUMENTS

| | | | | |
|---|---|---|---|---|
| 5,367,208 A * | 11/1994 | El Gamal | ......... | G01R 31/2884 326/38 |
| 5,698,992 A * | 12/1997 | El Ayat | ............ | G01R 31/2884 326/39 |
| 8,331,131 B2 * | 12/2012 | Miao | .................. | G11C 11/5685 257/1 |
| 8,437,172 B2 * | 5/2013 | Fiorentino | ............... | G11C 8/10 365/148 |
| 8,445,884 B2 * | 5/2013 | Xia | ........................ | B82Y 10/00 257/2 |
| 8,710,865 B2 * | 4/2014 | Yang | .................... | H03K 19/177 326/39 |
| 8,773,167 B2 * | 7/2014 | Robinett | ............ | G11C 13/0007 326/104 |
| 8,917,537 B2 * | 12/2014 | Ordentlich | ..................... | 365/148 |
| 9,036,395 B2 * | 5/2015 | Carter | ................ | G11C 13/0007 365/148 |
| 2014/0334216 A1 * | 11/2014 | Wang | ...................... | G11C 11/16 365/63 |
| 2015/0170025 A1 * | 6/2015 | Wu | ...................... | G06N 3/0635 706/25 |
| 2015/0171868 A1 * | 6/2015 | Rodriguez | ............. | H03K 19/08 326/38 |
| 2015/0256178 A1 * | 9/2015 | Kvatinsky | ........ | H03K 19/00346 326/31 |

OTHER PUBLICATIONS

Akers, Sheldon, "A Rectangle Logic Array," Aug. 1972, IEEE Transaction on Computers, vol. C-21, No. 8, pp. 842-857.*

(Continued)

*Primary Examiner* — Alexander H Taningco
*Assistant Examiner* — Nelson Correa
(74) *Attorney, Agent, or Firm* — Reches Patents

(57) ABSTRACT

A device that includes a memristive Akers logic array, wherein the memristive Akers logic array comprises multiple primitive logic cells that are coupled to each other; wherein each primitive logic cell comprises at least one memristive device.

18 Claims, 21 Drawing Sheets

(56) References Cited

OTHER PUBLICATIONS

Jeyavijayan Rajendran, Harika Manem, Ramesh Karri and Garrett S. Rose, "Memristor based Programmable Threshold Logic Array," 2010 IEEE/ACM International Symposium on Nanoscale Architectures, 978-1-4244-8019-7/10/$26.00, 2010 IEEE.*

Kvatinski, Shahar, 2014, Memristor-Based Circuits and Architectures, Ph.D. dissertation, May 2014, Technion, Department of Electrical Engineering (abstract copy).*

Akers, Sheldon, "A Rectangle Logic Array," Aug. 1972, IEEE Transactions on Computers, vol. C-21, No. 8, pp. 842-857.*

DFS. B. Akers, Jr., "A Rectangular Logic Array," IEEE Transactions on Computers, vol. C-21, No. 8, pp. 848-857, Aug. 1972.

H. T. Kung, "Why Systolic Architectures?" IEEE Computers, vol. 15, No. 1, pp. 37-46, Jan. 1982.

L. O. Chua, "memristor—The Missing Circuit Element," IEEE Transactions on Circuit Theory, vol. 18, No. 5, pp. 507-519, Sep. 1971.

S. Kvatinsky, N. Wald, G. Satat, E. G. Friedman, A. Kolodny, and U. C. Weiser, "MRL—Memristor Ratioed Logic," Proceedings of the International Cellular Nanoscale Networks and their Applications, pp. 1-6, Aug. 2012.

S. Kvatinsky, N. Wald, G. Satat, E. G. Friedman, A. Kolodny, and U. C. Weiser, "Memristor-based Material Implication (IMPLY) Logic: Design Principles and Methodologies," IEEE Transactions on Very Large Scale Integration (VLSI), vol. 22, No. 10, pp. 2054-2066, Oct. 2014.

S. Kvatinsky, E. G. Friedman, A. Kolodny, and U. C. Weiser, "Memristor-Based IMPLY Logic Design Procedure," Proceedings of the IEEE International Conference on Computer Design, pp. 142-147, Oct. 2011.

L. O. Chua and S. M. Kang, "memristive Devices and Systems," Proceedings of the IEEE, vol. 64, No. 2, pp. 209-223, Feb. 1976.

D. B. Strukov, G. S.Snider, D. R. Stewart, and R. S. Williams, "The Missing Memristor Found," Nature, vol. 453, pp. 80-83, May 2008.

X. Wang, Y. Chen, H. Xi, and D. Dimitrov, "Spintronic Memristor through Spin-Torque-Induced Magnetization Motion," IEEE Electron Device Letters, vol. 30, No. 3, pp. 294-297, Mar. 2009.

L. O. Chua, "Resistance Switching Memories are Memristors," Applied Physics A: Materials Science & Processing, vol. 102, No. 4, pp. 765-783, Mar. 2011.

R. Waser, R. Dittmann, G. Staikov, and K. Szot, "Redox-Based Resistive Switching Memories—Nanoionic Mechanisms, Prospects, and Challenges," Advanced Materials, vol. 21, Issue 25-26, pp. 2632-2663, Jul. 2009.

J. J. Yang, D. B. Strukov, and D. R. Stewart, "memristive Devices for Computing," Nature Nanotechnology, vol. 8, pp. 13-24, Jan. 2013.

S. Kvatinsky, N. Wald, G. Satat, E. G. Friedman, A. Kolodny, and U. C. Weiser, "MRL—Memristor Ratioed Logic for Hybrid CMOS-Memristor Circuits," IEEE Transactions on Nanotechnology (in review).

S. Kvatinsky, E. G. Friedman, A. Kolodny, and U. C. Weiser, "TEAM—ThrEshold Adaptive Memristor Model," IEEE Transactions on Circuits and Systems I: Regular Papers, vol. 60, No. 1, pp. 211-221, Jan. 2013.

E. Linn, R. Rosezin, C. Kügeler, and R. Waser, "Complementary Resistive Switches for Passive Nanocrossbar Memories," Nature Materials, vol. 9, No. 5, pp. 403-406, Apr. 2010.

O. Kavehei, S. Al-Sarawi, S., K.-R. Cho, K. Eshraghian, and D. Abbott, "An Analytical Approach for memristive Nanoarchitectures," IEEE Transactions on Nanotechnology, vol. 11, No. 2, pp. 374-385, Mar. 2012.

S. Kvatinsky, K. Talisveyberg, D. Fliter, E. G. Friedman, A. Kolodny, and U. C. Weiser, "Models of Memristors for SPICE Simulations," Proceedings of the IEEE Convention of Electrical and Electronics Engineers in Israel, pp. 1-5, Nov. 2012.

E. Yaakobi, A. Jiang, and J. Bruck, "In-Memory Computing of Akers Logic Array," Proceedings of the IEEE International Symposium on Information Theory, pp. 2369-2373, Jul. 2013.

S. Wolfram, "Universality and Complexity in Cellular Automata," Physica D: Nonlinear Phenomena, vol. 10, No. 1-2, pp. 1-35, Jan. 1984.

E. Gale, B. de Lacy Costello, and A. Adamatzky, "Boolean Logic Gates from a Single Memristor via Low-Level Sequential Logic," Proceedings of the International Conference on Unconventional Computation and Natural Computation, pp. 78-89, Jul. 2013.

E. Gale, B. de Lacy Costello, and A. Adamatzky, "Is Spiking Logic the Route to Memristor-Based Computers?" Proceedings of the International Conference on Electronics, Circuits and Systems, pp. 297-300, Dec. 2013.

M. D. Pickett and R S. Williams, "Phase Transitions Enable Computational Universality in Neuristor-Based Cellular Automata," Nanotechnology, vol. 24, No. 38, pp. 1-7, Sep. 2013.

S. Shin, K. Kim, and S.-M. Kang, "memristive XOR for resistive multiplier," Electronics Letters, vol. 48, No. 2, pp. 78-80, Jan. 2012.

E. Linn, R. Rosezin, S. Tappertzhofen, U. Bottger, and R. Waser, "Beyond von Neumann—Logical operation s in Passive Crossbar Arrays Alongside Memory Operations," Nanotechnology, vol. 23, No. 305205, Aug. 2012.

J. Borghetti, G. S. Snider, P. J. Kuekes, J. J. Yang, D. R. Stewart, and R. S. Williams, "memristive Switches Enable 'Stateful' Logical operation s via Material Implication," Nature, vol. 464, pp. 873-876, Apr. 2010.

S. Kvatinsky, D. Belousov, S. Liman, G. Satat, N. Wald, E. G. Friedman, A. Kolodny, and U. C. Weiser, "MAGIC—Memristor Aided LoGIC," IEEE Transactions on Circuits and Systems II: Express Briefs, vol. 61, No. 11, pp. 895-899, Nov. 2014.

Y. Levy, J. Bruck, Y. Cassuto, E. G. Friedman, A. Kolodny, E. Yaacobi, and S. Kvatinsky, "Logic Operation in Memory Using a Memristive Akers Array," Microelectronics Journal, vol. 45, No. 11, pp. 1429-1437, Nov. 2014.

S. Kvatinsky, M. Ramadan, E. G. Friedman, and A. Kolodny, "VTEAM—A General Model for Voltage Controlled Memristor," IEEE Transactions on Circuits and Systems II: Express Briefs (in press).

* cited by examiner

PRIOR ART

20

10

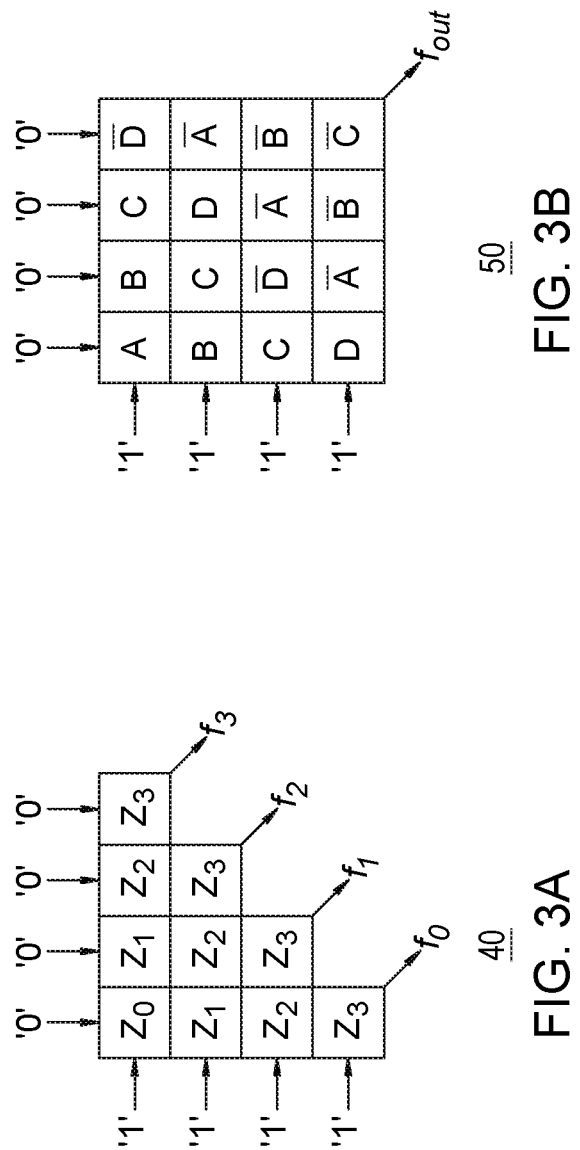

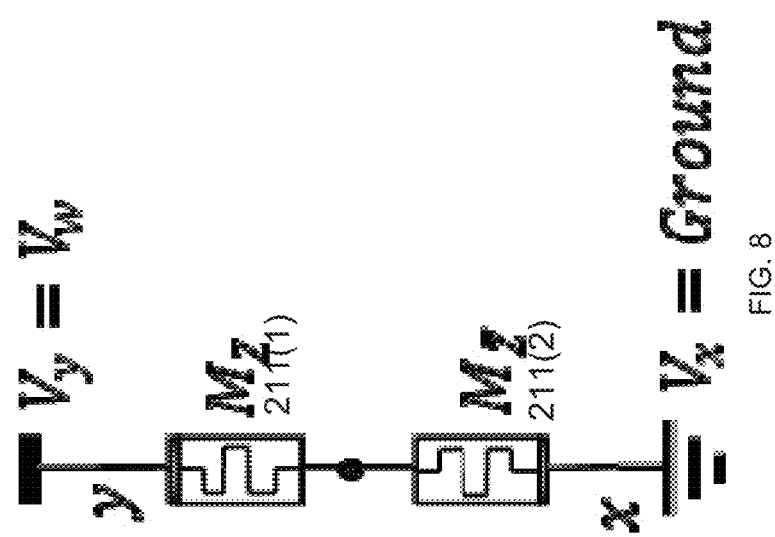

TABLE 1. AREA OF MEMORY TECHNOLOGIES

F – feature size, T – transistor, C – capacitor, and R – resistive device (memristor)

| Technology | Memory Cell | Area per Cell [$F^2$] | Computing Capabilities | Sequential |
|---|---|---|---|---|
| SRAM | 6 T | 140 | No | --- |
| DRAM | 1T 1C | 6-12 | No | --- |
| Flash | 1 T | 4 | No | --- |
| RRAM (memristive memory, single device per cell) | 1 R | 4 | Yes [5-6, 25-26] | Yes |
| Complementary Resistive Switches | 2 R | 4-8 | Yes [24] | Yes |
| Akers Array within Memory | 2 R 4 T | 20-90 | Yes | No |

FIG. 9B

TABLE 2. OUTPUT VOLTAGE OF PRIMITIVE LOGIC CELL FROM (4)

| $x$ | $y$ | $z$ | $R_Z$ | $V_f$ – derived from (4) | $f(x,y,z)$ |
|---|---|---|---|---|---|
| 0 | 0 | 0 | $R_{OFF}$ | 0 | 0 |
| 0 | 0 | 1 | $R_{ON}$ | 0 | 0 |
| 0 | 1 | 0 | $R_{OFF}$ | $\dfrac{R_{ON}}{R_{OFF}+R_{ON}} \cdot V_r$ | 0 |
| 0 | 1 | 1 | $R_{ON}$ | $\dfrac{R_{OFF}}{R_{OFF}+R_{ON}} \cdot V_r$ | 1 |
| 1 | 0 | 0 | $R_{OFF}$ | $\dfrac{R_{OFF}}{R_{OFF}+R_{ON}} \cdot V_r$ | 1 |
| 1 | 0 | 1 | $R_{ON}$ | $\dfrac{R_{ON}}{R_{OFF}+R_{ON}} \cdot V_r$ | 0 |
| 1 | 1 | 0 | $R_{OFF}$ | $V_r$ | 1 |
| 1 | 1 | 1 | $R_{ON}$ | $V_r$ | 1 |

FIG. 9C

TABLE 3. MEMRISTOR PARAMETERS

| | |
|---|---|
| $k_{on}$ | -8 m/sec |
| $k_{off}$ | 0.5 m/sec |
| $i_{on}$ | -10 uA |
| $i_{off}$ | 10 uA |
| $x_{on}$ | 0 |
| $x_{off}$ | 3 nm |
| $a_{on}$ | 1 |
| $a_{off}$ | 4 |
| $R_{ON}$ | 100 Ω |
| $R_{OFF}$ | 100 kΩ |
| $V_w$ | 3 V |
| $V_r$ | 1 V |
| CMOS Selectors | CMOS 0.18 μm process W = 0.42 μm |

FIG. 9D

MEMRISTIVE AKERS LOGIC ARRAY

RELATED APPLICATION

This application claims priority from US provisional patent titled "MEMRISTIVE AKERS LOGIC ARRAY", filing date Jul. 14 2014, Ser. No. 62/023,967 which is incorporated herein by reference.

BACKGROUND

Conventional computers are based on a von Neumann architecture, where separate units process and store data—see memory 11 coupled to arithmetic logical unit (ALU) 12, wherein ALU 12 is coupled to input 13 and output 14 circuits. A different approach is to process data within the same unit that stores the data (i.e., process data within memory)—thus arithmetic logical memory 21 is coupled to ALU 22 that is coupled to input 13 and output 14 circuits. An illustration of both architectures is shown in FIGS. 1A-1B. In this paper, a hardware version of processing within memory is proposed. The proposed circuit is based on a study of rectangular logic arrays, first proposed in 1972 by Sheldon Akers [1].

In an Akers logic array (or, in short, an Akers logic array), the execution of any Boolean function is performed by flowing data across an array of primitive logic cells. The data are transferred from each primitive logic cell to neighboring cells, as shown in FIG. 2A—array 30 is shown as including 3×3 primitive logic cells such as 30(1,1) of FIG. 2B. The operation of an Akers logic array is similar to systolic array [2] and cellular automata [19]. The primitive logic cell 30(1,1) has three inputs and two outputs, as shown in FIG. 2B. The inputs of the primitive logic cell include two control inputs x and y and a variable input z, which is replaced in our circuit by an internal state (i.e., the stored data). The primitive logic cell performs a predefined logical operation f(x, y, z), which is described below. The output of each primitive logic cell is used as control inputs x and y of, respectively, the bottom and right neighboring primitive logic cells.

To execute any Boolean function within an Akers logic array, specific input values are inserted as control inputs into the left-most column and the upper-most row. The control input y of the left-most column is set to 1 for all rows, and the control input x of the upper-most row is set to 0 for all columns, as shown in FIG. 2A. These control inputs along with the array structure and the function f(x, y, z) determine the Boolean function computed by the array. The inputs to this Boolean function are the bits stored within the array cells. The output of the Boolean function computed by the Akers logic array is the output of the primitive logic cell at the bottom right of the array. It is also possible to define multiple Boolean functions (or, alternatively, a multi-bit output) on the same Akers logic array, in which case additional primitive cell outputs are used as external functional outputs. To date, an Akers logic array has been treated as a mathematical concept since the benefit of an Akers logic array with conventional semiconductor technology (i.e., CMOS technology) is limited.

SUMMARY OF THE INVENTION

According to an embodiment of the invention various methods may be provided and are described in the specification. Additional embodiments of the invention include a device that may be arranged to execute any or all of the methods described in the specification above, including any stages- and any combinations of same.

According to an embodiment of the invention there may be provided a device and a method.

The device may include a memristive Akers logic array, wherein the memristive Akers logic array may include multiple primitive logic cells that are coupled to each other; wherein each primitive logic cell may include at least one memristive device.

The primitive logic cell has two input ports for receiving two input signals and two output ports for outputting primitive logic cell output signals, wherein each primitive logic cell output signal is a function of the first and second input signals and of states of the at least one memristive device.

The primitive logic cell may include first and second memristive devices that are serially coupled to each other and are of opposite polarities.

The device may include a write circuit that is arranged to set the first and second memristive devices to opposite states during a write phase that precedes a logical operation phase during which the memristive Akers logic array performs a logical operation.

The device may include a read circuit that is arranged to read at least one memristive Akers logic array output signal, the at least one memristive Akers logic array output signal is calculated by the memristive Akers logic array during a logical operation phase during which the memristive Akers logic array performs a logical operation.

The primitive logic cell has two input ports for receiving two primitive logic cell input signals and two output ports for outputting a primitive logic cell output signal, wherein the first input port is coupled to a first terminal of the first memristive device, the second input port is coupled to a first terminal of the second memristive device, the second terminals of the first and second memristive devices are coupled to each other and to the two output ports.

The primitive logic cell output signal is a function of the first and second input signals and of states of the first and second memristive devices.

The device may include a first group of switches and a second group of switches; wherein the first group of switches couples a write circuit to the two input ports and wherein the second group of switches couples the output port to a read circuit.

The first and second groups of switches may be transistors.

The first and second groups of switches may be transistors that are implemented in one or more silicon layers that are positioned below metal layers in which the memristors are implemented.

The memristive Akers logic array may be included in a memory unit.

The memristive devices of the memristive Akers logic array may be are used as memory elements during a storage phase.

A method may include setting states of memristive devices of a memristive Akers logic array during a write phase; wherein the memristive Akers logic array may include multiple primitive logic cells that are coupled to each other; wherein each primitive logic cell may include at least one memristive device; and performing a logical operation by the memristive Akers logic array during a logical operation phase and providing a memristive Akers logic array output signal that is responsive to at least some of the states of the memristive devices and to memristive Akers logic array input signals provided to the memristive Akers logic array during the logical operation phase.

The primitive logic cell may have two input ports for receiving two primitive logic cell input signals and two output ports for outputting primitive logic cell output signals, wherein a primitive logic cell output signal outputted by each primitive logic cell is a function of the first and second primitive logic cell input signals and of states of the at least one memristive device of the primitive logic cell.

The primitive logic cell may include first and second memristive devices that are serially coupled to each other and are of opposite polarities.

The method may include setting, by a write circuit, the first and second memristive devices to opposite states during the write phase.

The method may include reading, by a read circuit, at least one memristive Akers logic array output signal, the at least one output signal is the outcome of the logical operation.

The primitive logic cell may have two input ports for receiving two primitive logic cell input signals and two output ports for outputting primitive logic cell output signals, wherein the first input port is coupled to a first terminal of the first memristive device, the second input port is coupled to a first terminal of the second memristive device, the second terminals of the first and second memristive devices are coupled to each other and to the two output ports.

The method wherein the primitive logic cell output signals are a function of the first and second primitive logic cell input signals and of states of the first and second memristive devices.

The method may include coupling, by a first group of switches, a write circuit to the two input ports and coupling, by a second group of switches the primitive logic cell output ports to a read circuit.

The first and second groups of switches may be transistors.

The first and second groups of switches may be transistors that are implemented in one or more silicon layers that are positioned below metal layers in which the memristors are implemented.

The memristive Akers logic array may be included in a memory unit.

The method may include storing in memristive devices of the memristive Akers logic array information during a storage phase.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3A illustrates a four-bit input structure for an Akers logic array for performing a sort $\{z_0, z_1, z_2, z_3,\}$ logical operation;

FIG. 3B illustrates a four-bit input structure for an Akers logic array for a XOR(A, B, C, D) logical operation;

FIG. 8 illustrates a write operation of logical one to memristor $M_Z$, according to an embodiment of the invention;

FIG. 9B includes table 1 that provides a comparison of areas of different memory technologies including a technology according to an embodiment of the invention;

FIG. 9C includes table 2 that provides a mapping between primitive logic cells inputs and output signals and states of memristive devices according to an embodiment of the invention;

FIG. 9D includes table 3 that provides examples of memristive device parameters according to an embodiment of the invention;

Figure 1B:
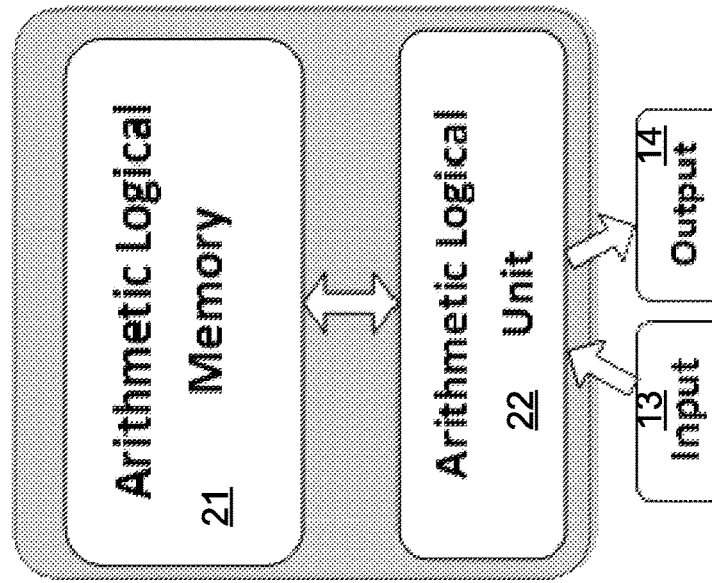
FIG. 1B illustrates a processing within memory architecture in which the memory can also process data, according to an embodiment of the invention.
Figure 1A:
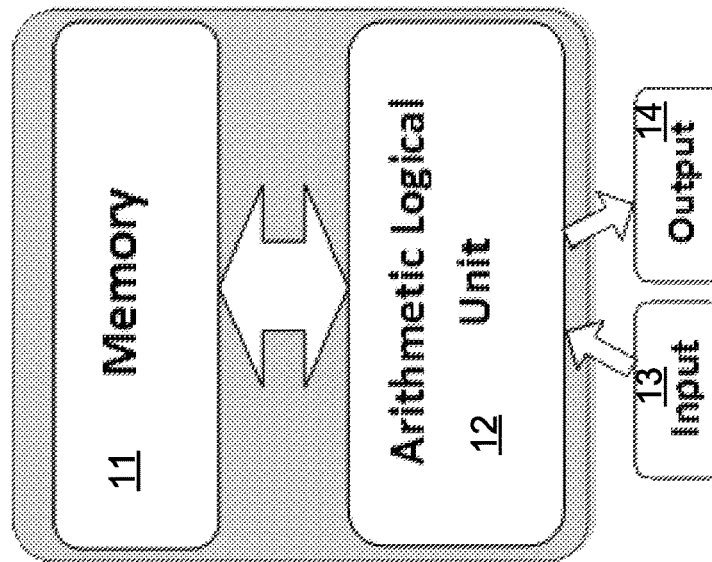
FIG. 1A illustrates a von Neumann architecture—separate memory and an ALU.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

The emergence of memristive technologies [3] enables the integration of computation and memory, including logic within memory [5-6, 20-26]. The high density of memristors and compatibility with CMOS makes an Akers logic array with memristors practical. In this paper, a memristive Akers logic array is proposed, where the variables z are stored within the memristive cells, and the control inputs x and y are voltages. The proposed memristive Akers logic array serves as a practical example of in-memory computation.

Akers Logic Array

Figure 2B:
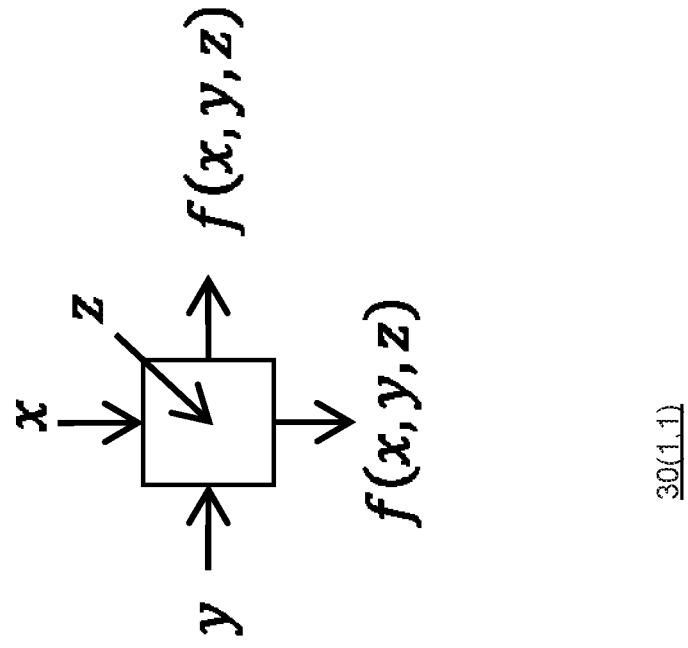
FIG. 2B illustrates a prior art primitive logic cell of the Akers logic array with three inputs x, y, z and two identical outputs f(x, y, z)
Figure 2A:
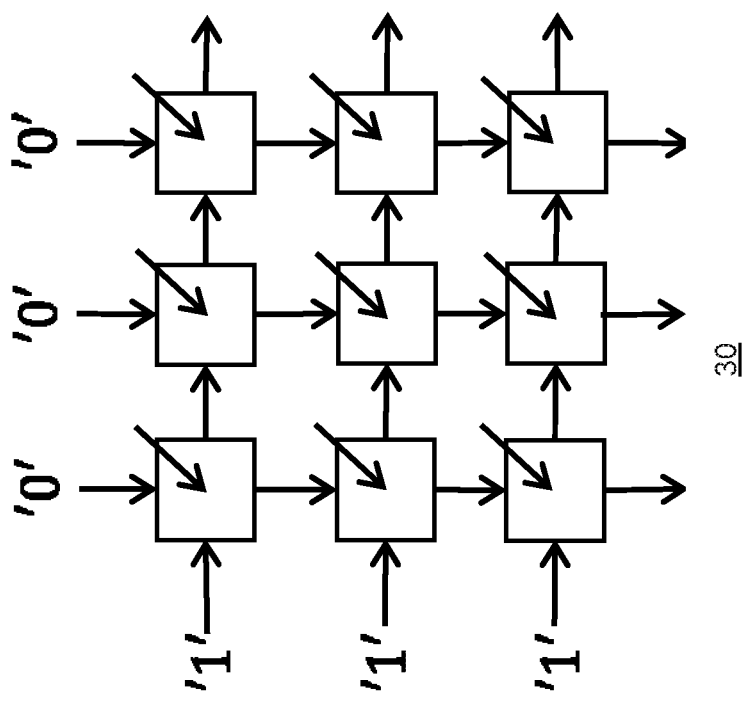
FIG. 2A illustrates a prior art Akers logic array.

An Akers logic array is a two-dimensional array of identical primitive logic cells connected in a rectangular grid, as shown in FIG. 2A. The primitive logic cell in the array is a three input logic gate that executes the logical operation:

$$f(x,y,z) = x\bar{z} + yz. \quad (1)$$

Note that in the original Akers logic array [1], four alternative logical operations that generate the correct behavior of the array are proposed. In this paper, only (1) is used due to the easy implementation with memristors.

The output of each primitive logic cell is transferred to the two neighboring primitive logic cells in the array—one below and one to the right of the array. The transferred data are the x and y control inputs of, respectively, the vertical and horizontal neighbors, as shown in FIG. 2A. The control input y of the left-most column is set to 1 for all rows, and the control input x of the upper-most row is set to 0 for all columns.

The execution of a Boolean function is performed by organizing the contents of the array cells according to the particular specification, and reading the functional output from the output of the lower-right cell (or from multiple cell outputs in the case of a Boolean function with a multiple bit output or, alternatively, multiple Boolean functions simultaneously computed within the same array). Hence, the same array can be used for different Boolean functions, each specifying a different organization of inputs. Examples of several Boolean functions are illustrated in FIGS. 3A-3B.

Akers logic array 40 of ten primitive logic cells for sorting of four bits $\{z_0, z_1, z_2, z_3\}$ is shown in FIG. 3A. The binary sorting function on n inputs is defined as the n Boolean functions $f_0, f_{n-1}$, where $f_i(z_0, \ldots, z_{n-1})=1$ if the number of "1" inputs among $z_0, \ldots, z_{n-1}$ is greater than i (i.e., $f_0$ is the maximum value and $f_{n-1}$ is the minimum of the output). For the sorting function, each input variable of the sorting Boolean function is replicated a number of times up to the number of inputs [1]. For example, $z_3$ is replicated four times, while $z_1$ is replicated two times. The number of primitive logic cells is therefore $$\sum_{i=0}^{n-1}(i+1) = \frac{n^2}{2} + \frac{n}{2}$$

where n is the number of inputs to the sorting Boolean function. The output bits of the sorting Boolean function are placed along the diagonal of the array, as shown in FIG. 3A.

Another example for a Boolean function within an Akers logic array 50 is a four-bit XOR [1], as shown in FIG. 3B. The variable inputs of the primitive logic cells are arranged similarly to the sorting array, where the complementary value of the XOR inputs are also stored as input variables of the primitive logic cells. The output of the XOR operation is the output of the bottom right primitive logic cell. The number of primitive logic cells for an n-bit XOR is n×n (n multiplied by n).

Since the inputs of the Boolean function must be replicated within an array, the number of primitive logic cells increases quadratically with the number of inputs of the Boolean function. A CMOS Akers logic array therefore requires significant area, making an Akers logic array impractical with standard CMOS. In contrast, the density and circuit architecture of memristive devices make the Akers logic array natural for memories. A memristive Akers logic array within memory can be denser than standard SRAM (without computation capabilities), as listed in Table 1 of FIG. 9B.

Memristors

Figure 4:
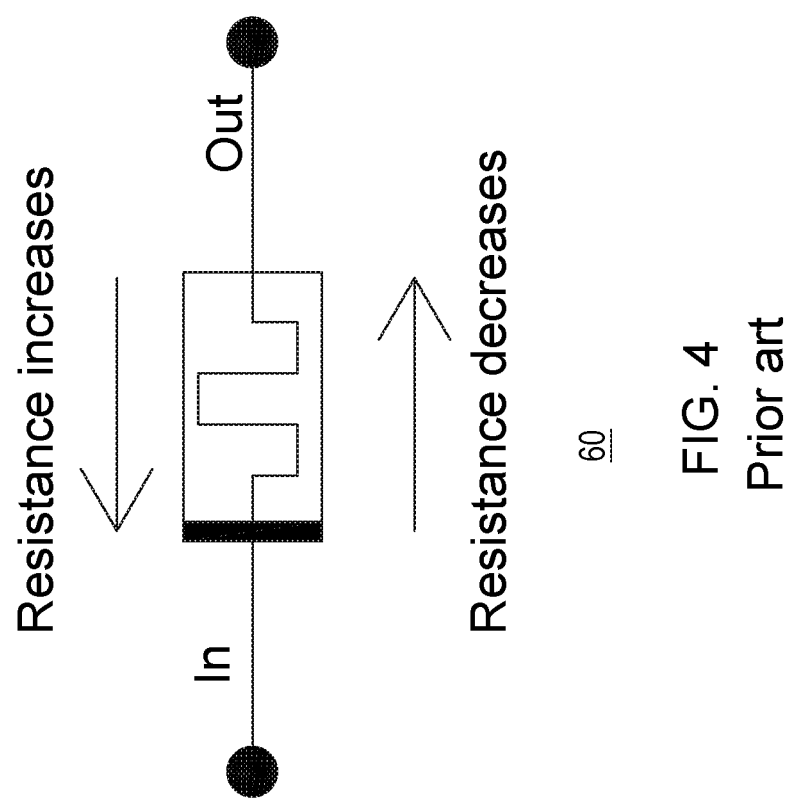
FIG. 4 illustrates a prior art memristive having a resistance that increases when current flows into the memristive device and decreases when the current flows out of the memristive device.

Memristive devices [3, 7] include memristors and are two-port passive elements with varying resistance. The change in the resistance of these devices depends on the current flowing through the device 60 (or, alternatively, the voltage across the device), as shown in FIG. 4. While in theory the change in the resistance of a memristor depends directly on the current (or voltage), for memristive devices the dependence can be more complicated and described by internal state variables [7]. In this paper, the term memristor is used to describe a memristive device. A memristive device is any memory device that relies on resistance, including resistive random access memory (RRAM), Phase change memory (PCM), Spin-transfer torque magnetic random-access memory (STT-MRAM), Conductive bridging random access memory (CBRAM), etc.

Since 2008, numerous emerging nonvolatile memory technologies have been connected to the theory of memristors [8-12]. These technologies are nonvolatile, fast, dense, CMOS compatible, low power, and have high write endurance. The compatibility of memristors with CMOS enables the use of memristors not only as memory, but also as logic circuits [4-6, 13, 20-26].

Several models have been proposed to describe the behavior of memristors. The TEAM model is used [14]. The TEAM model is general and can fit memristors from different technologies. In the TEAM model, it is assumed that a memristor has current thresholds, $i_{off}$ and $i_{on}$, and an internal state variable x. When the current flowing through the memristor is above the current thresholds, the memristor changes state either from $R_{on}$ to $R_{off}$ or from $R_{off}$ to $R_{on}$ depending upon the original state and direction of the current.

Figure 5:
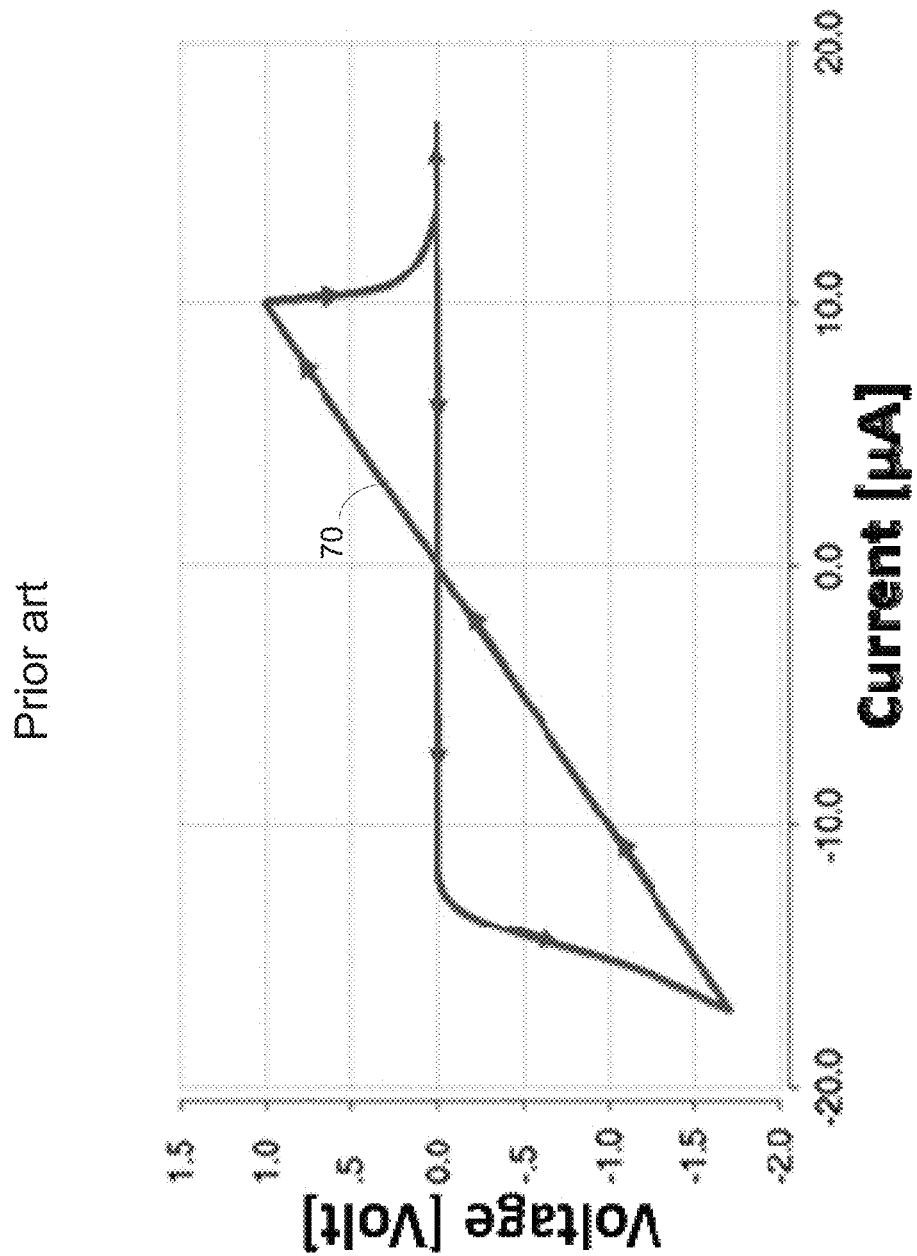
FIG. 5 illustrates current-voltage characteristics of a memristor based on the TEAM model [14] for a sinusoidal current input with an amplitude of 17 µA and frequency of 100 kHz.

The voltage-current relationship and the change in state variable are described by $$v(t) = \left[ R_{ON} + \frac{R_{OFF} - R_{ON}}{x_{off} - x_{on}} (x - x_{on}) \right] \cdot i(t) \quad (2)$$

$$\frac{dx(t)}{dt} = \begin{cases} k_{off} \cdot \left( \frac{i(t)}{i_{off}} - 1 \right)^{\alpha_{off}} \cdot f_{off}(x), & 0 < i_{off} < i, \quad (3a) \\ k_{on} \cdot \left( \frac{i(t)}{i_{on}} - 1 \right)^{\alpha_{on}} \cdot f_{on}(x), & i < i_{on} < 0, \quad (3b) \\ 0, & \text{otherwise}, \quad (3c) \end{cases}$$

Where $R_{ON}$ and $R_{OFF}$ are, respectively, the minimum and maximum resistance of the memristor, $x_{on}$ and $x_{off}$ are, respectively the minimum and maximum value of the state variable x, $f_{on}(x)$ and $f_{off}(x)$ are window functions (the TEAM window function is used in this paper), and $k_{off}$, $k_{on}$, $\alpha_{off}$, and $\alpha_{on}$ are fitting parameters. An example of an I-V curve 70 of the TEAM model is shown in FIG. 5.

Memristive Akers Logic Array

As previously mentioned, an Akers logic array with conventional CMOS technology is impractical due to the significant area requirements. The use of memristors, which are dense and fabricated physically above the CMOS transistors, significantly reduces the area.

The proposed memristive Akers primitive logic cell is based on the structure of complementary memristors (or complementary resistive switches, CRS) [15, 16]. In the proposed memristive realization of an Akers logic array, the input variable z is the stored internal state of a memristor. The inputs of the executed Boolean function are therefore treated as stored data within a memristive memory array. In this section, the structure of the primitive logic cell is described as well as the operation of the array Primitive Logic Cell Structure The proposed primitive logic cell realizes the logical connectivity described by (1). The primitive cell consists of two serial memristors 101 and 102 connected with opposite polarity, as shown in FIG. 6A. The control inputs of the primitive logic cell 100 x and y (inputs 112 and 111 respectively) are voltages (logical one and zero are, respectively, a positive voltage $V_r$ and ground). The variable input z is the stored logical state of memristor $M_Z$, which is represented by the resistance of the device (low and high resistances are considered, respectively, as logical one and zero). The memristor $M_{\bar{Z}}$ has the complementary logical state of $M_Z$. The stored logical state of $M_Z$ and $M_{\bar{Z}}$ are written during a write operation prior to execution. The output signal of the primitive logic cell 100 is at junction 113 connected to both memristors 101 and 102.

Figure 6B:
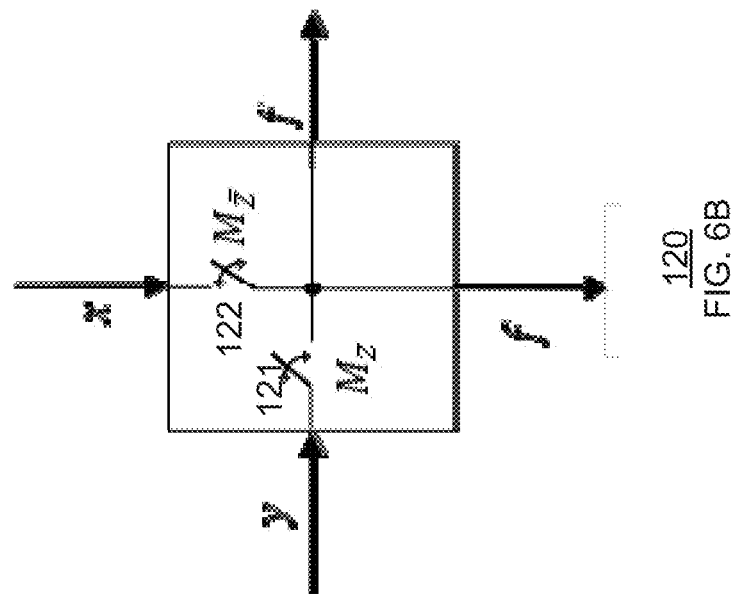
FIG. 6B illustrates a behavioral model of the primitive logic cell, where the memristors are modeled as ideal switches according to an embodiment of the invention.
Figure 6A:
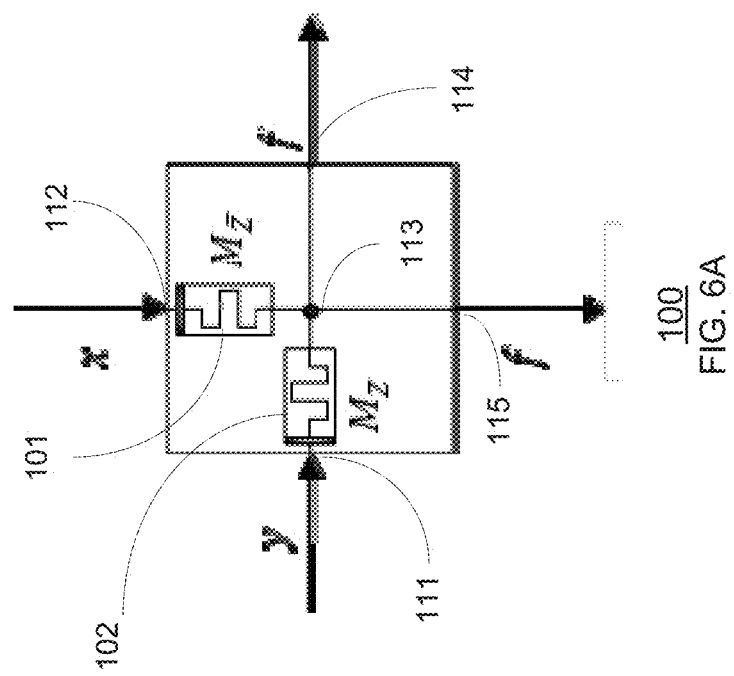
FIG. 6A illustrates a primitive logic cell according to an embodiment of the invention.

Ideally, the memristors can be modeled as switches (denoted 121 and 122 of model 120 in FIG. 6B), where a high resistance is an open circuit and a low resistance is a short circuit, as shown in FIG. 6B. In an ideal model, one switch is open and the other switch is closed. If z is logical one, the switch of z is closed and the logical value of y is transferred to the output. If z is logical zero, the switch is open and the complementary switch is closed, transferring x to the output.

The precise output of the primitive logic cell is the result of a voltage divider between $M_Z$ and $M_{\bar{Z}}$. The output voltage $V_f$ is $$V_f = \frac{V_y - V_x}{R_{\bar{Z}} + R_Z} \cdot R_Z + V_x, \quad (4)$$

Where $R_Z$ and $R_{\bar{Z}}$ are, respectively, the resistance of memristors $M_Z$ and $M_{\bar{Z}}$, varying from $R_{on}$ to $R_{off}$. $V_x$ and $V_y$ are the input voltages x and y. The output voltage $V_f$ for different input conditions is listed in Table 2, demonstrating that, as required, the primitive logic cell indeed executes the Boolean function (1).

Logic Array Operation

Figure 7A:
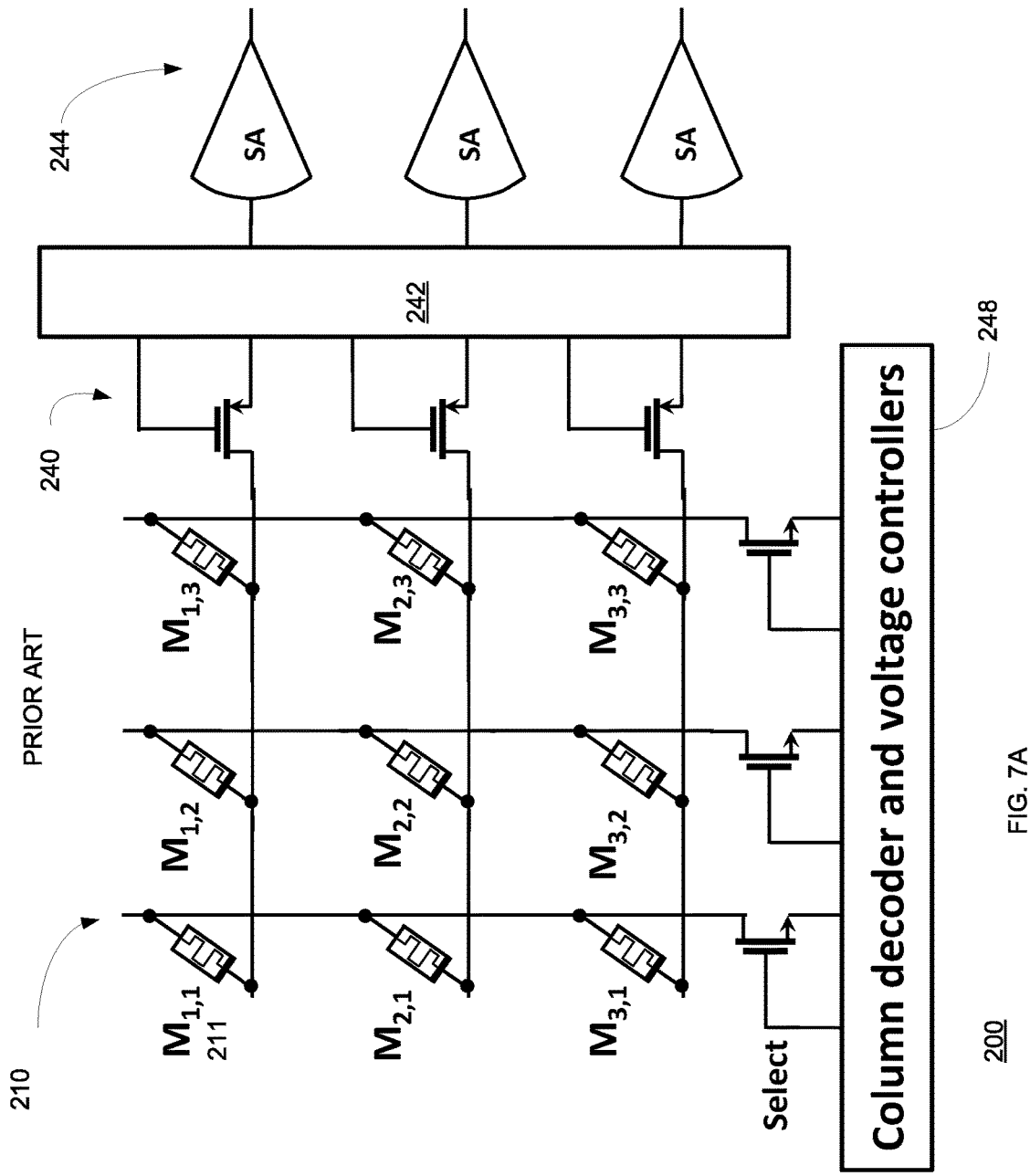
FIG. 7A illustrates a memristor crossbar having a single memristor coupled between each column line and each row line.

FIG. 7A illustrates a memristor crossbar 200. The memristor crossbar includes an array 201 of memristors—one memristor (such as 211 and 233) is coupled between each row line and column line of the memristor crossbar 200. The rows and columns are coupled to a write circuit (not shown) and to a read circuit that is illustrated as including row switches (transistors 240), column switches (transistors 246), row decoder and voltage controller 242, column decoder and voltage controller 248 and sense amplifiers 244. Other read and write circuits can be provided.

Figure 7B:
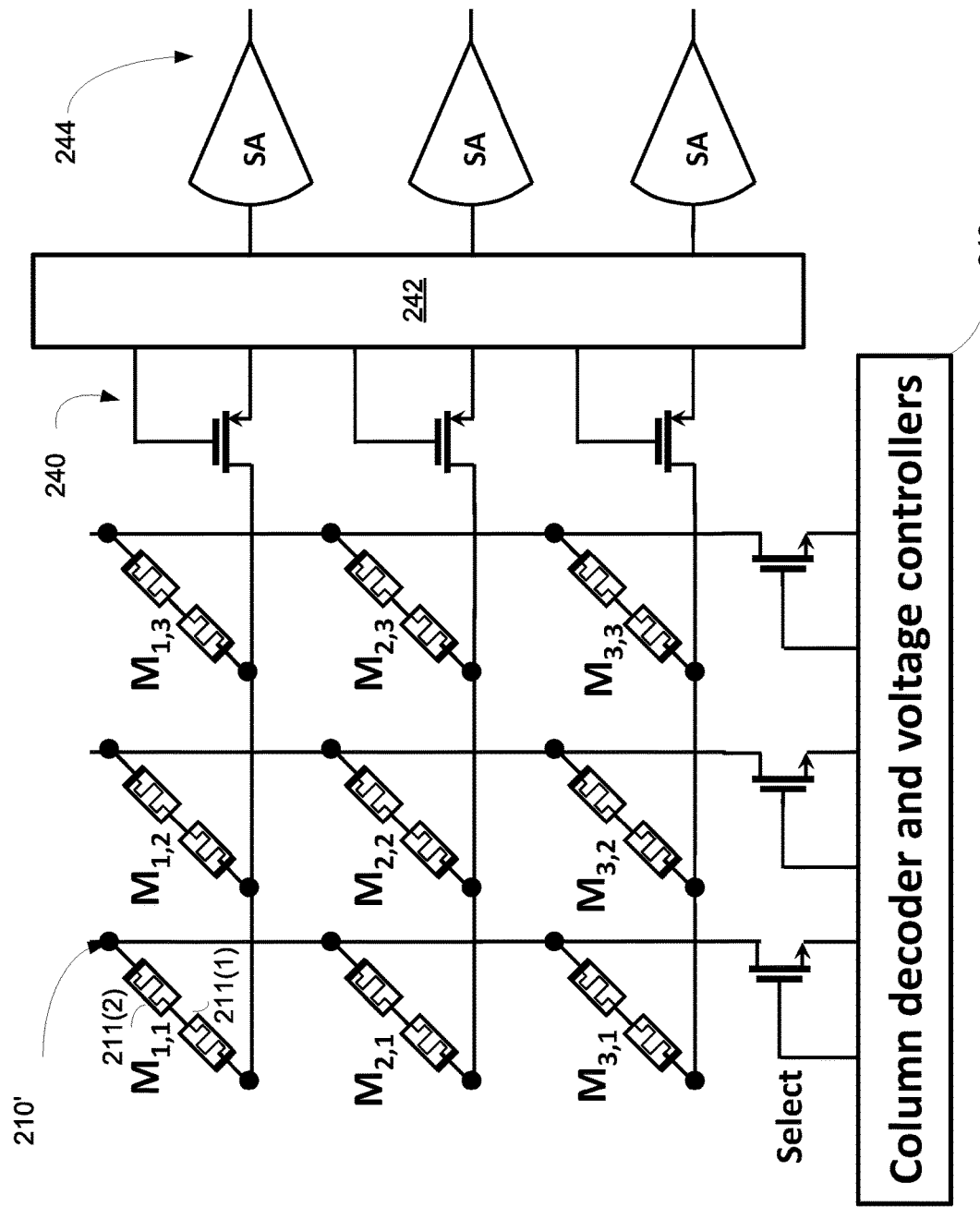
FIG. 7B illustrates a memristor crossbar having a pair of memristors of opposite polarity coupled between each column line and each row line according to an embodiment of the invention.

FIG. 7B illustrates a memristor crossbar 200'. Memristor crossbar 200' differs from memristor crossbar 200 by having a pair of memristors (such as pair 211(1) and 211(2) of opposite polarity) coupled between each row line and column line of the memristor crossbar 200'.

Figure 7C:
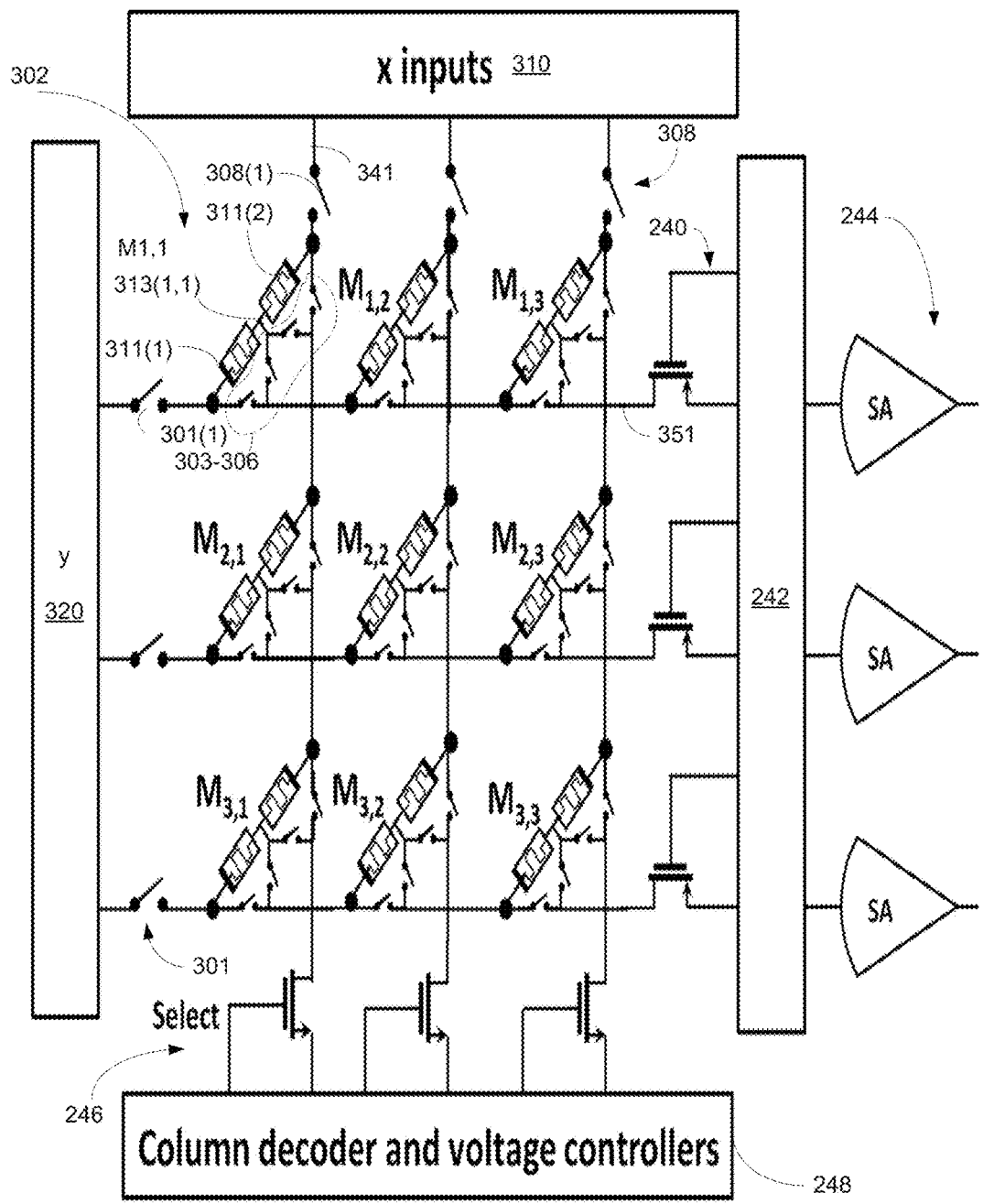
FIG. 7C illustrates a read circuit, a write circuit and an Akers memristor array according to an embodiment of the invention.

Each pair of memristors that are of opposite polarity forms a primitive logic cells that can also be used as a memory array, as shown in FIG. 7C. Unlike regular memory arrays, the memristive Akers logic array can compute different Boolean functions in addition to storing data. The computation of Boolean functions within the logic array is divided into two stages. The initial stage is a "write" operation to the memristors. In this stage, the initial logical state of memristors $M_Z$ and $M_{\bar{Z}}$ is simultaneously written. This stage can be part of a regular write operation of the memory or, alternatively, an explicit initialization prior to computing the Boolean function. In this paper, initialization of a single primitive logic cell is evaluated. Writing to the array (e.g., addressing the specific primitive cells within the array and parallelizing the writes) is only briefly discussed since this process is similar in any CRS-based memory (e.g., see [16]). Relevant adjustments (e.g., adding CMOS selectors to achieve isolation between the primitive cells and maintain regular read and write operations), however, need to be performed to achieve a memory integrated with an Akers logic array, as shown in FIG. 7C.

FIG. 7C illustrates a read circuit, a write circuit and an Akers memristor array 302 according to an embodiment of the invention.

The read circuit is illustrated as including row switches (transistors 240), column switches (transistors 246), row decoder and voltage controller 242, column decoder and voltage controller 248 and sense amplifiers 244.

The write circuit is illustrated as including row switches (collectively denoted 301—the first row switch is denoted 301(1)), column switches (collectively denoted 308—the first column switch is denoted 308(1)), column write circuit—x input 310 and row write circuit—y input 320. The row switches are coupled between the row lines and the row write circuit while the column switches are coupled between the column lines and the column write circuit.

Each primitive logic cell of Akers memristor array 302 has two input ports for receiving two primitive logic cell input signals and two output ports for outputting a primitive logic cell output signal. The first input port is coupled to a first terminal of the first memristive device, the second input port is coupled to a first terminal of the second memristive device, the second terminals of the first and second memristive devices are coupled to each other and to the two output ports.

Referring to the upper left primitive logic cell of Akers memristor array 302—it includes first and second memristors 311(1) and 311(2). The first terminal of first memristor 311(1) is coupled via first switches 301(1) and 303 to first row 351 and has a second terminal coupled to junction 313(1,1). The first terminal of second memristor 311(2) is coupled via first switches 308(1) and 306 to first column 341 and has a second terminal coupled to output junction 313(1,1). Output junction 313(1,1) is coupled via second switches 304 and 305 to first column 341 and to first row 351.

Referring to the upper left primitive logic cell of Akers memristor array 302—when the pair of memristors 311(1) and 311(2) are used as memory cells—switches 304 and 305 are open thus disconnecting junction 313(1,1) from the row and column lines 341 and 351 and switches 301(1), 308(1), 304 and 305 are closed. When writing to the pair of memristors at least switches 301(1), 308(1) are closed. When performing a logical operation switches 304 and 305 are closed thus connecting junction 313(1,1) to the row and column lines 341 and 351 and switches 304 and 305 are open.

The second stage executes the Boolean function. In this stage, a low voltage is used to ensure that the resistance of the memristors in the array does not change.

Stage 1—Initialization of the Primitive Logic Cells (Write)

Initialization of the logical states of $M_Z$ and $M_{\bar{Z}}$ is simultaneously achieved due to the serial connection of both memristors of opposite polarity. In the complementary structure, applying a sufficiently high voltage to both memristors switches both memristors to different resistances, where one memristor achieves a high resistance and the other memristor achieves a low resistance. The write procedure in a complementary pair of memristors 211(1) and 211(2) is shown in FIG. 8.

To write a logical one to $M_Z$, the resistances $M_Z$ and $M_{\bar{Z}}$ are required to be, respectively, a low and high resistance. The write procedure therefore applies a sufficiently positive voltage $V_w$ to y while grounding x. To write a logical zero to $M_Z$, the write procedure applies $V_w$ to x while grounding y, or alternatively, apply $-V_w$ to y and grounding x. At the end of the write operation, the resistance of $M_Z$ and $M_{\bar{Z}}$ are $R_{ON}$ and $R_{OFF}$, where the resistance of one memristor is $R_{ON}$ and the resistance of the other memristor is $R_{OFF}$.

Stage 2—Execution of the Boolean Function (Read)

The structure of the memristive Akers logic array is shown in FIG. 7C. The array is similar to the structure of the original Akers logic array but include memristors. In a memristive Akers logic array, each primitive logic cell consists of complementary memristors. The x and y control inputs are voltages, and, as in the original (without memristors) Akers logic array, the input y of the left-most column is set to logical one (execution voltage $V_r$), and the input x of the upper row is set to logical zero (ground) for all columns. Since the output of the memristive primitive logic cell is a voltage, the result of the logical operation for each primitive logic cell is transferred to the neighboring cells.

To maintain correct operation of the memristive Akers logic array, the resistance of the memristors in the array must not change during execution. The current flowing through the memristors $I_r$ is therefore maintained lower than the threshold current of the memristors. The current is $$I_r = \frac{|V_y - V_x|}{(R_Z + R_{\bar{Z}})} \leq \frac{(V_r)}{(R_{ON} + R_{OFF})} < \max(|i_{off}|, |i_{on}|). \quad (5)$$

Evaluation of Primitive Logic Cells

In this section, the proposed memristive primitive logic cell is evaluated with 0.18 μm CMOS and simulated in SPICE. A Verilog-A TEAM model [17] is used to simulate the behavior of the memristors.

Figure 9A:
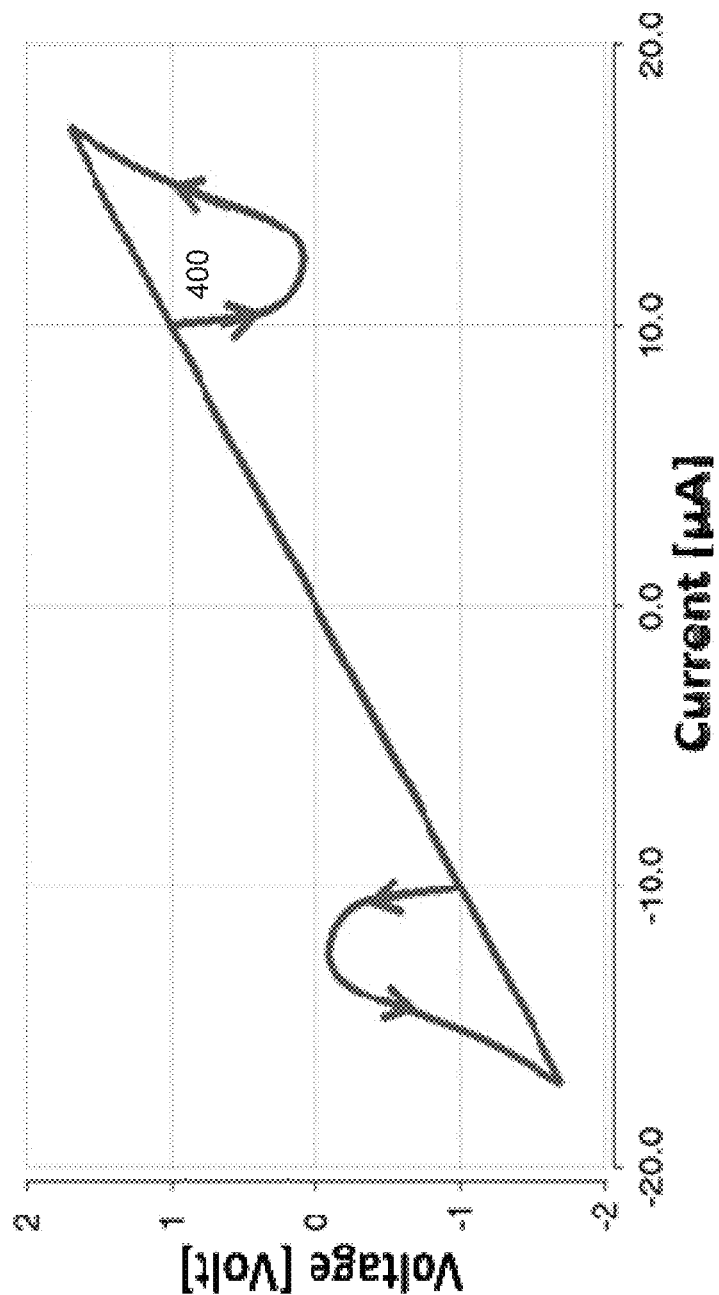
FIG. 9A is a current-voltage characteristic of the primitive logic cell for a sinusoidal current input with an amplitude of 17 µA and frequency of 100 kHz.

The primitive logic cell is based on a complementary resistive switch structure. The CRS behaves as a linear resistor with a resistance of $R_{ON}+R_{OFF}$ below a certain voltage. Above this voltage, hysteresis exists in the current-voltage curve of the CRS [15, 16]. The current-voltage curve 400 of the primitive logic cell is shown in FIG. 9A. The circuit parameters related to FIG. 9A are listed in Table 2 of FIG. 9C. For a current lower than the current thresholds $i_{on}$ and $i_{off}$ (10 μA), the resistance of both memristors is constant. For a current higher than the current thresholds, the resistance of both memristors changes.

Figure 10A:
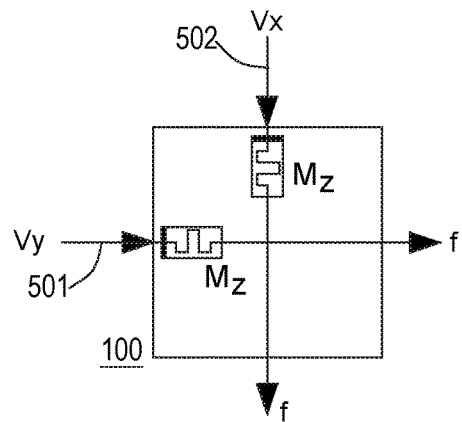
FIG. 10A illustrates a schematic of a simulated circuit, according to an embodiment of the invention.
Figure 10B:
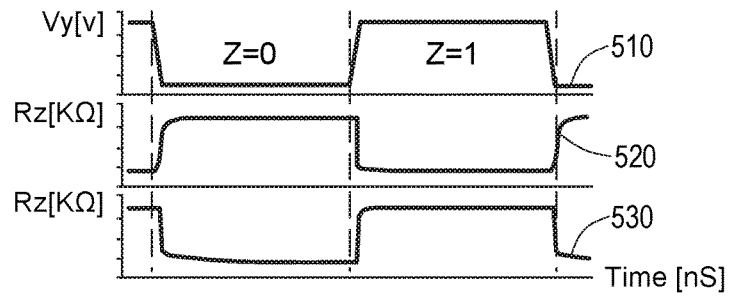
FIG. 10B illustrates a simulation of memristive initialization operation according to an embodiment of the invention.

The primitive logic cell is evaluated with and without CMOS selectors connected to the control inputs, x and y. The primitive logic cell drives a load capacitor of 10 fF. The parameters used for the memristors are listed in Table 3 of FIG. 9D. A schematic of the simulated primitive logic cell 100 having two memristors and connected to y select switch 501 and to x select switch 502 is shown in FIG. 10A. The results of the initializing stage (curves 510, 520 and 530) are shown in FIG. 10B. The write latency of the primitive cell depends upon the switching time of the memristor, assumed as 1.1 ns. The primitive logic cell exhibits a write latency of 6.6 ns (six times more than the switching time of a single memristor).

Figure 10C:
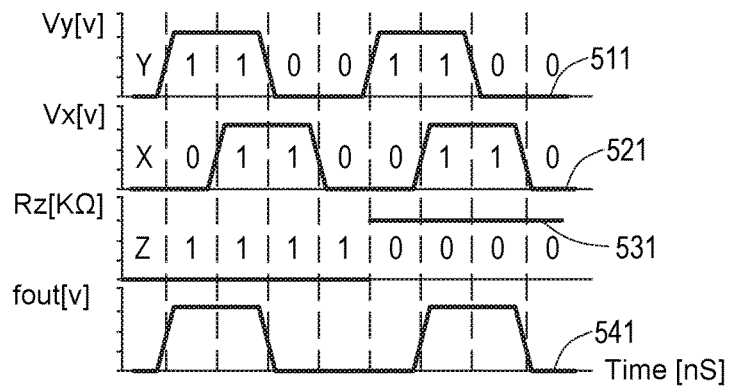
FIG. 10C illustrates a simulation of memristive initialization operation without selectors according to an embodiment of the invention.

The results of the execution stage are shown in FIGS. 10C (curves 511, 521, 531 and 541) and 10D (curves 512, 522, 532 and 542). The primitive logic cell executes the correct logical behavior with degradation in the output signal. The degradation depends upon the ratio between $R_{OFF}$ and $R_{ON}$. The output degradation is 0.1% without selectors ($R_{OFF}$/

$R_{ON}$=1000) and 4% with CMOS selectors (for a 0.18 μm CMOS process). The output degradation is discussed in the following section.

Output Degradation

Since memristors are passive elements, signal degradation occurs at the output of each primitive logic cell. The degradation depends primarily on the ratio between $R_{OFF}$ and $R_{ON}$, where a higher ratio reduces the degradation. The degradation limits the size of the Akers logic array.

Figure 11A:
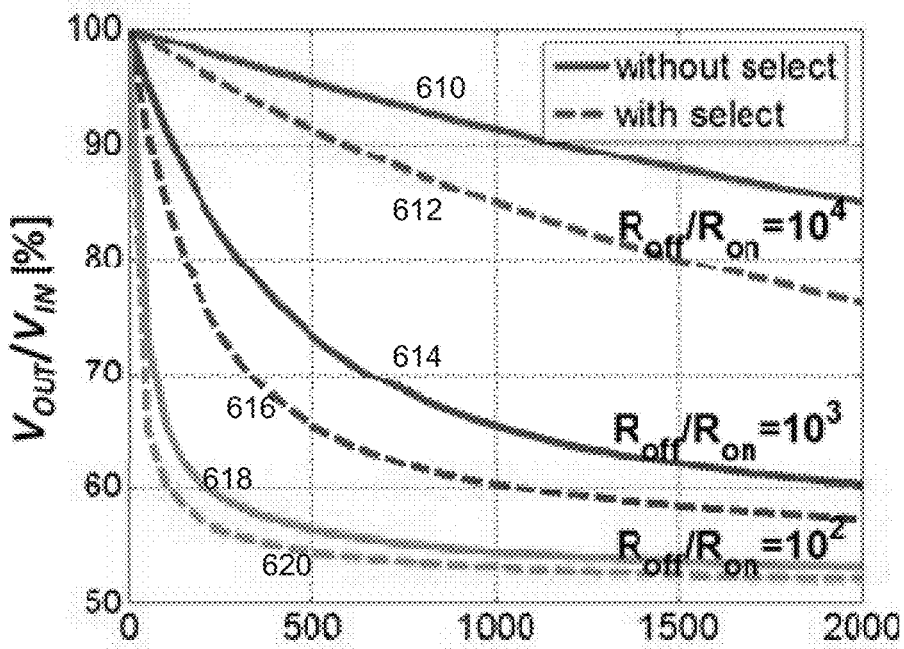
FIG. 11A illustrates an output signal degradation as a function of rectangular array size for different $R_{OFF}/R_{ON}$ ratios according to various embodiments of the invention.
Figure 11B:
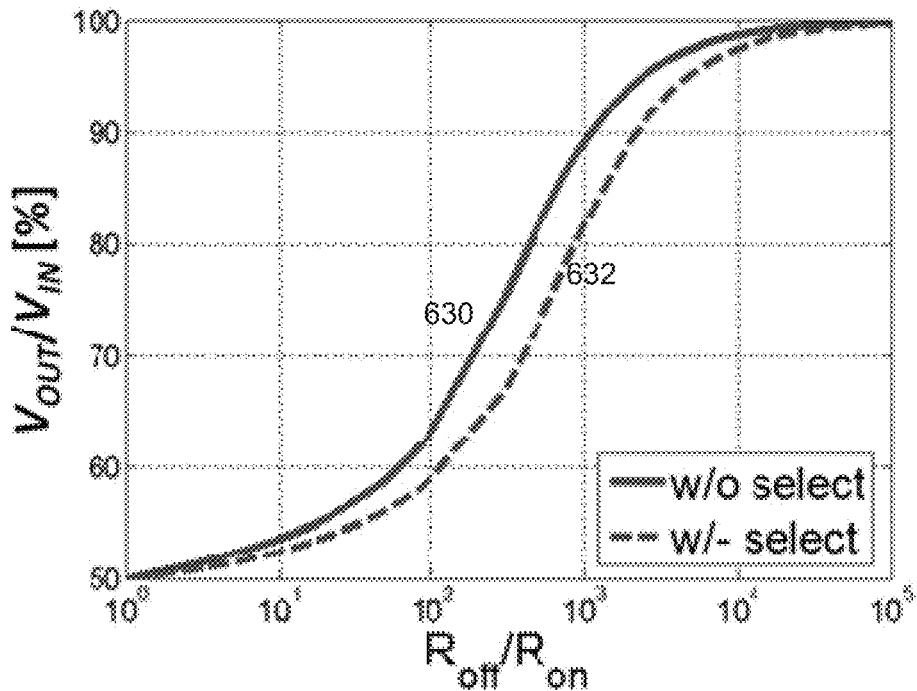
FIG. 11B illustrates an output signal degradation in rectangular array of 128 by 128 as a function of the resistance ratio $R_{OFF}/R_{ON}$ with CMOS selector. $R_{ON}=1$ kΩ, the resistance of a CMOS selector is 1 kΩ according to various embodiments of the invention.

The degradation of the output signal as a function of array size is shown in FIG. 11A (curves 610, 612, 614, 616, 618 and 620) for Akers logic arrays with and without CMOS selectors. The use of CMOS selectors makes the output degradation worse since the CMOS element adds a resistance in series. For larger arrays, the degradation is more significant and limits the size of the sub-arrays of the memory. The degradation for different ratios of $R_{OFF}$ and $R_{ON}$ is shown in FIG. 11B (curves 630 and 632).

For an array composed of 128 by 128 primitive logic cells, the minimal degradation of the output reaches 10% for $R_{OFF}/R_{ON}$=1000. For arrays with CMOS selector with a resistance of 1 kΩ, the actual output degradation is 15%. Using larger CMOS transistors lowers the degradation. A higher $R_{OFF}/R_{ON}$ ratio enables a larger array, where a ratio of 10,000 enables arrays of more than a million logic primitive cells with an output degradation of 10%.

Test Case—Memristor-Based Logic within Memory Array

To evaluate a memristive Akers logic array, several Boolean functions are investigated within the array. In this section, simulation results of a two-input XOR and sorting of four bits are presented as simple test examples.

Two-Input XOR

Figure 10D:
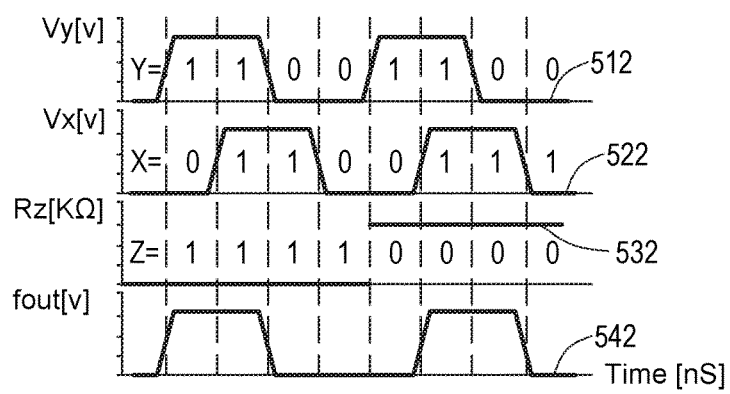
FIG. 10D illustrates a simulation of memristive initialization operation with selectors according to an embodiment of the invention.
Figure 12A:
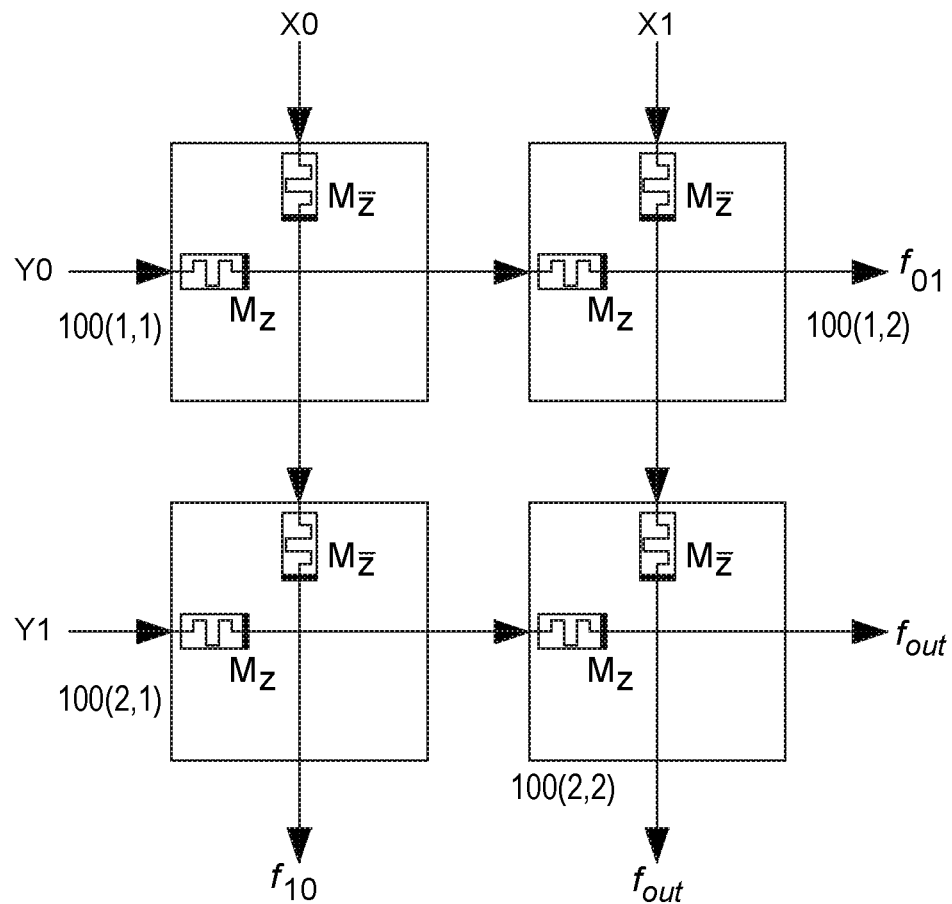
FIG. 12A illustrates a two-input XOR Akers logic array according to an embodiment of the invention.
Figure 12B:
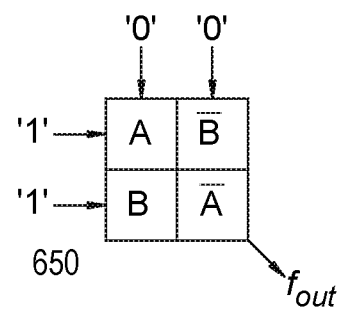
FIG. 12B illustrates array structure of the Boolean function XOR(A, B) according to an embodiment of the invention.

The schematic and array structure of an 2 by two XOR(A, B) are shown in FIGS. 12A-12B. The memristive Akers logic array is a two by two array, consisting of eight memristors belonging to four primitive logic cells 100(1,1), 100(1,2), 100(2,1) and 100(2,2). Initializing the array (writing the inputs to the memristors) is achieved prior to execution. The execution is evaluated with the same parameters listed in Table 3 of FIG. 10D, exhibiting the correct output. The average and maximum output degradation are, respectively, 20% and 31% for a two-input XOR with 0.18 μm CMOS selectors (3% without selectors). The relatively high degradation is due to the minimal size of the CMOS selectors and the use of high voltage transistors, which have a relatively high resistance. As previously mentioned, increasing the width of the transistors significantly lowers the signal degradation.

Figure 13A:
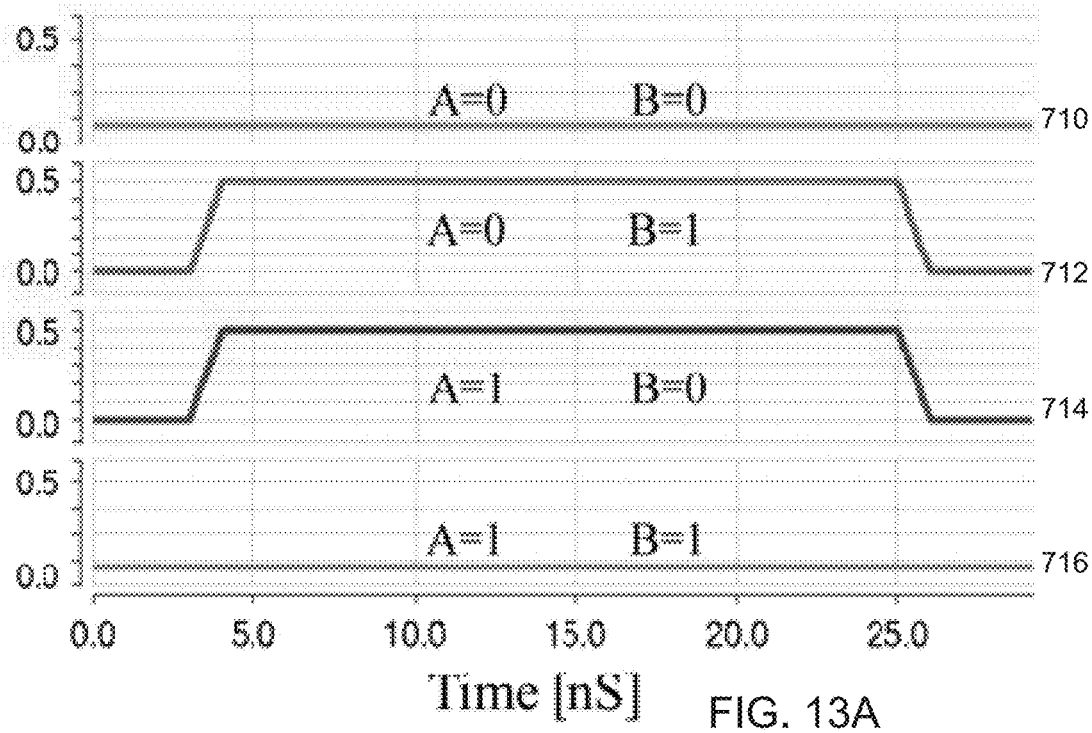
FIG. 13A illustrates simulation results of a two-input XOR without CMOS selectors according to an embodiment of the invention.
Figure 13B:
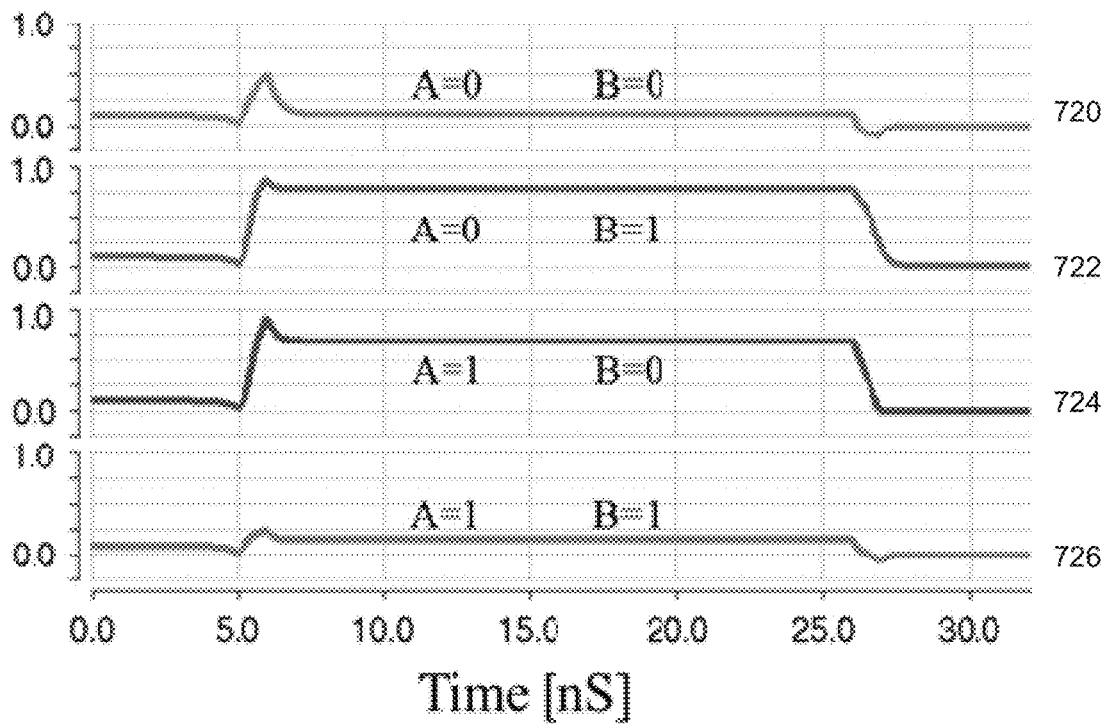
FIG. 13B illustrates simulation results of a two-input XOR with CMOS selectors according to an embodiment of the invention.

The average power of the array during execution is, respectively, 6.2 μW and 33.6 μW without and with CMOS selectors. The results for different input conditions are shown in FIG. 13A (curves 710, 712, 714 and 716) and FIG. 13B (curves 720, 722, 724 and 726). For small arrays, adding CMOS selectors does not affect the speed of the circuit. For an array with CMOS selectors, execution is slower due to the capacitance of the selectors.

Sorting of Bits

Figure 14A:
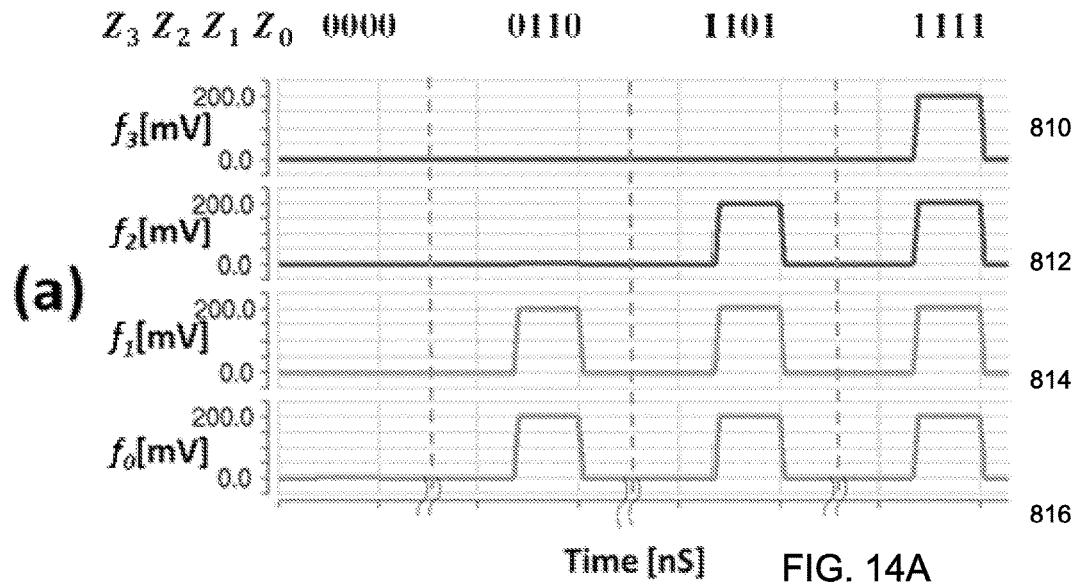
FIG. 14A illustrates simulation results of a four-bit set sort using a four by four memristive Akers logic array without CMOS selectors for different output values according to an embodiment of the invention.
Figure 14B:
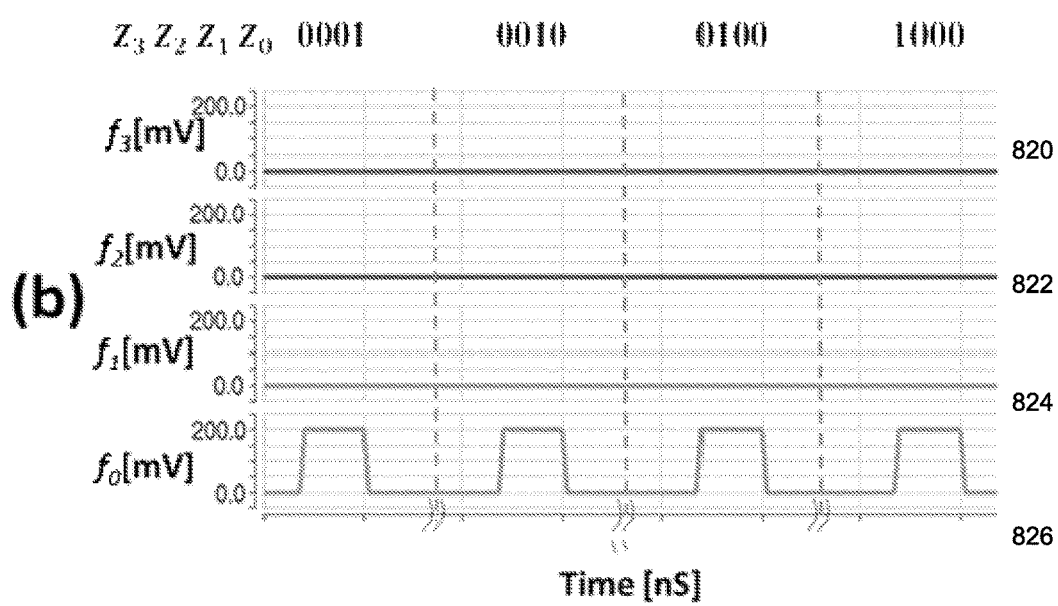
FIG. 14B illustrates simulation results of a four-bit set sort using a four by four memristive Akers logic array without CMOS selectors for different inputs, all with a single logical one and three zeros according to an embodiment of the invention.

To evaluate sorting of bits, a four-bit sorting Boolean function is executed within the memristive Akers logic array. The memristive Akers logic array consists of ten primitive logic cells (see FIG. 3A) and 20 memristors. The execution is evaluated with the same parameters listed in Table 3, showing correct output and an average output degradation of 0.3% without CMOS selectors. The average power of the array during execution is 1.6 μW. Results for different input conditions are shown in FIG. 14A (curves 810, 812, 814 and 816) and FIG. 14B (curves 820, 822, 824 and 826).

The proposed memristive Akers logic array contains a pair of complementary memristors in each cell. The array can therefore be used as a memristive memory, where a single bit is stored within a memristor pair rather than a single memristor [15, 16]. Each cell also performs a primitive Boolean operation, which enables the logic functionality of the array, as initially shown by Akers. The combination of an Akers logic array and memory is promising and may lead to additional uses, as described in [18]. For example, an Akers logic array naturally performs bit sorting which may lead to efficient sorting of words and other data structures.

The integration of memristive memory with a logic array that executes any Boolean function can lead to a variety of novel non-von Neumann architectures. The Akers logic array architecture eliminates the memory bottleneck, reducing power and bandwidth. memristive Akers logic arrays may also be beneficial for image processing applications and error correcting operations within memory.

Figure 15:
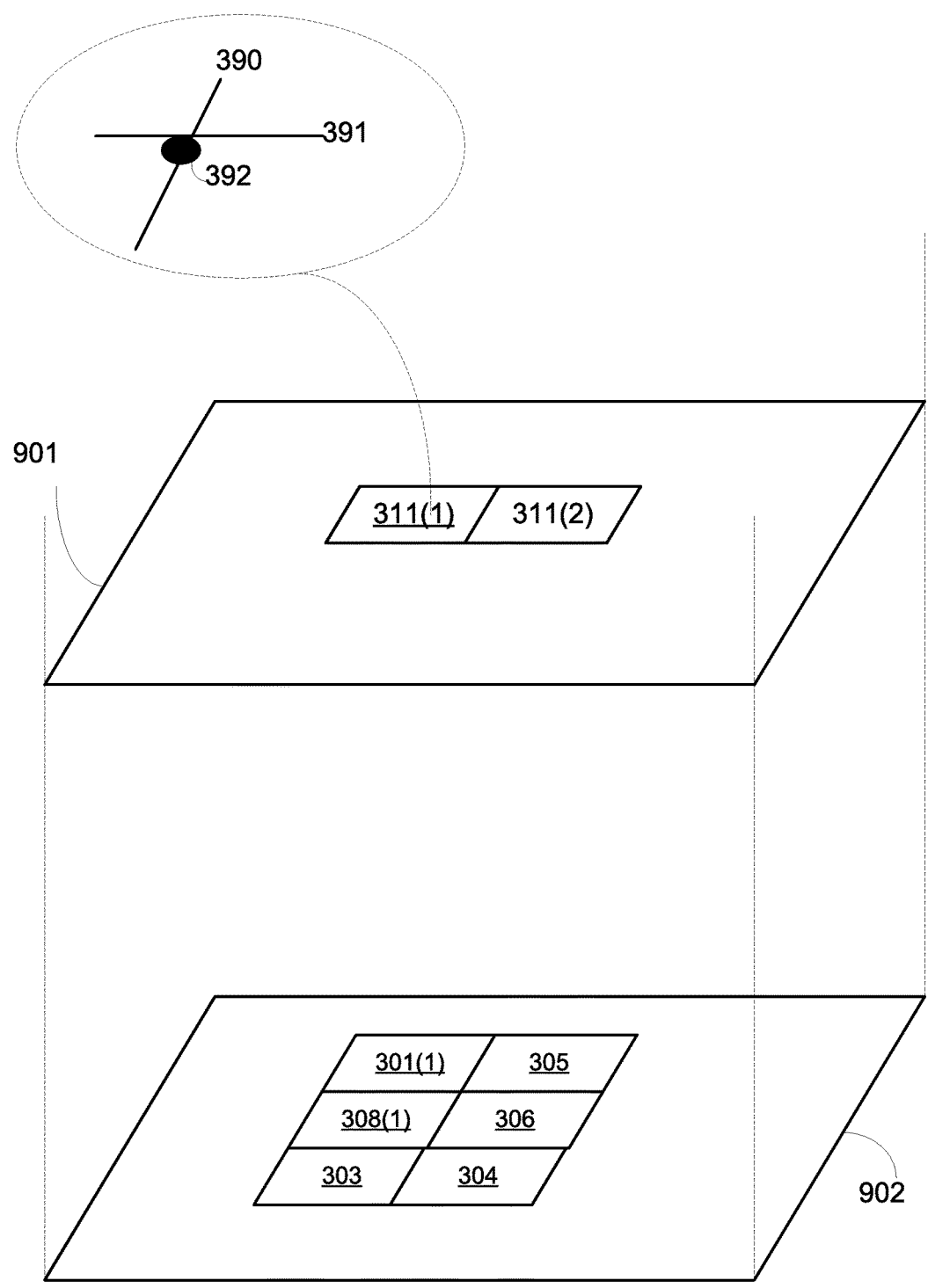
FIG. 15 illustrates a portion of a device according to an embodiment of the invention.

FIG. 15 illustrates a portion 900 of a device according to an embodiment of the invention.

Switches such as switches 301(1), 303, 304-306 and 308(1) that are implemented in a silicone layer 901 positioned below metal layer 902 in which memristors 311(1) and 311(2) are implemented. FIG. 15 shows that switches 301(1), 303, 304-306 and 308(1) are positioned directly below which memristors 311(1) and 311(2)—and thus the distance between these components is very short—contributing to the very fast operation. FIG. 15 also shows that a memristor out of 311(1) and 311(2) can include two metal layer conductors 390 and 391 and a memristor interface 392 that connects these two conductors.

Figure 16:
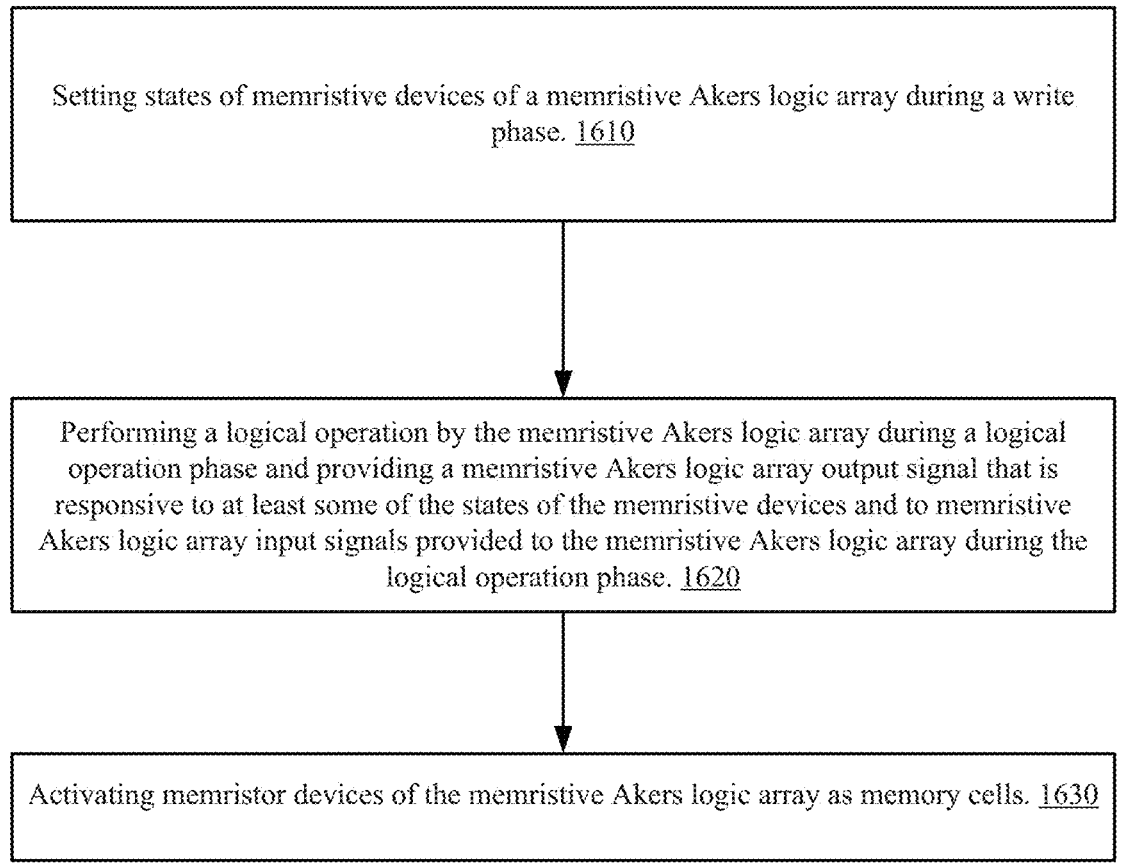
FIG. 16 illustrates a method according to an embodiment of the invention.

FIG. 16 illustrates a method 1600 according to an embodiment of the invention.

Method 1600 may start by stage 1610 of setting states of memristive devices of a memristive Akers logic array during a write phase. The memristive Akers logic array includes multiple primitive logic cells that are coupled to each other. Each primitive logic cell includes at least one memristive device.

Stage 1610 may be followed by stage 1620 of performing a logical operation by the memristive Akers logic array during a logical operation phase and providing a memristive Akers logic array output signal that is responsive to at least some of the states of the memristive devices and to memristive Akers logic array input signals provided to the memristive Akers logic array during the logical operation phase. Stage 1620 may include providing more than a single memristive Akers logic array output signal.

Stage 1620 may be followed by stage 1630 of activating memristor devices of the memristive Akers logic array as memory cells. This may include reading and writing the content of these memristor devices. These operations may include disconnecting an output junction through which the output of logical operation is being outputted from. Thus the memristive devices may be used to store information during a storage phase.

Stage 1610 may include setting, by the write circuit, first and second memristive devices of a primitive logic cells that are serially connected to each other and have opposite polarities to opposite states.

Stage 1620 may include reading, by a read circuit, at least one memristive Akers logic array output signal, the at least one output signal is the outcome of the logical operation.

Reference to some of the following papers were provided, only references published before Jul. 14 2014 can be regarded as prior art publications and only publications that were published before Jul. 14 2013 cannot be overcome by swearing back.

[1] D F S. B. Akers, Jr., "A Rectangular Logic Array," IEEE Transactions on Computers, Vol. C-21, No. 8, pp. 848-857, August 1972.
[2] H. T. Kung, "Why Systolic Architectures?" IEEE Computers, Vol. 15, No. 1, pp. 37-46, January 1982.
[3] L. O. Chua, "Memristor—The Missing Circuit Element," IEEE Transactions on Circuit Theory, Vol. 18, No. 5, pp. 507-519, September 1971.
[4] S. Kvatinsky, N. Wald, G. Satat, E. G. Friedman, A. Kolodny, and U. C. Weiser, "MRL—Memristor Ratioed Logic," Proceedings of the International Cellular Nano scale Networks and their Applications, pp. 1-6, August 2012.
[5] S. Kvatinsky, N. Wald, G. Satat, E. G. Friedman, A. Kolodny, and U. C. Weiser, "Memristor-based Material Implication (IMPLY) Logic: Design Principles and Methodologies," IEEE Transactions on Very Large Scale Integration (VLSI), vol. 22, no. 10, pp. 2054-2066, October 2014.
[6] S. Kvatinsky, E. G. Friedman, A. Kolodny, and U. C. Weiser, "Memristor-Based IMPLY Logic Design Procedure," Proceedings of the IEEE International Conference on Computer Design, pp. 142-147, October 2011.
[7] L. O. Chua and S. M. Kang, "memristive Devices and Systems," Proceedings of the IEEE, Vol. 64, No. 2, pp. 209-223, February 1976.
[8] D. B. Strukov, G. S. Snider, D. R. Stewart, and R. S. Williams, "The Missing Memristor Found," Nature, Vol. 453, pp. 80-83, May 2008.
[9] X. Wang, Y. Chen, H. Xi, and D. Dimitrov, "Spintronic Memristor through Spin-Torque-Induced Magnetization Motion," IEEE Electron Device Letters, Vol. 30, No. 3, pp. 294-297, March 2009.
[10] L. O. Chua, "Resistance Switching Memories are Memristors," Applied Physics A: Materials Science & Processing, Vol. 102, No. 4, pp. 765-783, March 2011.
[11] R. Waser, R. Dittmann, G. Staikov, and K. Szot, "Redox-Based Resistive Switching Memories—Nanoionic Mechanisms, Prospects, and Challenges," Advanced Materials, Vol. 21, Issue 25-26, pp. 2632-2663, July 2009.
[12] J. J. Yang, D. B. Strukov, and D. R. Stewart, "memristive Devices for Computing," Nature Nanotechnology, Vol. 8, pp. 13-24, January 2013.
[13] S. Kvatinsky, N. Wald, G. Satat, E. G. Friedman, A. Kolodny, and U. C. Weiser, "MRL—Memristor Ratioed Logic for Hybrid CMOS-Memristor Circuits," IEEE Transactions on Nanotechnology (in review).
[14] S. Kvatinsky, E. G. Friedman, A. Kolodny, and U. C. Weiser, "TEAM—ThrEshold Adaptive Memristor Model," IEEE Transactions on Circuits and Systems I: Regular Papers, Vol. 60, No. 1, pp. 211-221, January 2013.
[15] E. Linn, R. Rosezin, C. Kügeler, and R. Waser, "Complementary Resistive Switches for Passive Nanocrossbar Memories," Nature Materials, Vol. 9, No. 5, pp. 403-406, April 2010.
[16] 0. Kavehei, S. Al-Sarawi, S., K.-R. Cho, K. Eshraghian, and D. Abbott, "An Analytical Approach for memristive Nanoarchitectures," IEEE Transactions on Nanotechnology, Vol. 11, No. 2, pp. 374-385, March 2012.
[17] S. Kvatinsky, K. Talisveyberg, D. Fliter, E. G. Friedman, A. Kolodny, and U. C. Weiser, "Models of Memristors for SPICE Simulations," Proceedings of the IEEE Convention of Electrical and Electronics Engineers in Israel, pp. 1-5, November 2012.
[18] E. Yaakobi, A. Jiang, and J. Bruck, "In-Memory Computing of Akers Logic Array," Proceedings of the IEEE International Symposium on Information Theory, pp. 2369-2373, July 2013.
[19] S. Wolfram, "Universality and Complexity in Cellular Automata," Physica D: Nonlinear Phenomena, Vol. 10, No. 1-2, pp. 1-35, January 1984.
[20] E. Gale, B. de Lacy Costello, and A. Adamatzky, "Boolean Logic Gates from a Single Memristor via Low-Level Sequential Logic," Proceedings of the International Conference on Unconventional Computation and Natural Computation, pp. 78-89, July 2013.
[21] E. Gale, B. de Lacy Costello, and A. Adamatzky, "Is Spiking Logic the Route to Memristor-Based Computers?" Proceedings of the International Conference on Electronics, Circuits and Systems, pp. 297-300, December 2013.
[22] M. D. Pickett and R S. Williams, "Phase Transitions Enable Computational Universality in Neuristor-Based Cellular Automata," Nanotechnology, Vol. 24, No. 38, pp. 1-7, September 2013.
[23] S. Shin, K. Kim, and S.-M. Kang, "memristive XOR for resistive multiplier," Electronics Letters, Vol. 48, No. 2, pp. 78-80, January 2012.
[24] E. Linn, R. Rosezin, S. Tappertzhofen, U. Böttger, and R. Waser, "Beyond von Neumann—Logical operation s in Passive Crossbar Arrays Alongside Memory Operations," Nanotechnology, Vol. 23, No. 305205, August 2012.
[25] J. Borghetti, G. S. Snider, P. J. Kuekes, J. J. Yang, D. R. Stewart, and R. S. Williams, "memristive Switches Enable 'Stateful' Logical operation s via Material Implication," Nature, Vol. 464, pp. 873-876, April 2010.
[26] S. Kvatinsky, D. Belousov, S. Liman, G. Satat, N. Wald, E. G. Friedman, A. Kolodny, and U. C. Weiser, "MAGIC—Memristor Aided LoGIC," IEEE Transactions on Circuits and Systems II: Express Briefs, vol. 61, No. 11, pp. 895-899, November 2014.
[27] Y. Levy, J. Bruck, Y. Cassuto, E. G. Friedman, A. Kolodny, E. Yaacobi, and S. Kvatinsky, "Logic Operation in Memory Using a Memristive Akers Array," Microelectronics Journal, Vol. 45, No. 11, pp. 1429-1437, November 2014.
[28] S. Kvatinsky, M. Ramadan, E. G. Friedman, and A. Kolodny, "VTEAM—A General Model for Voltage Controlled Memristor," IEEE Transactions on Circuits and Systems II: Express Briefs (in press).

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A device that comprises a memristive Akers logic array, wherein the memristive Akers logic array comprises multiple primitive logic cells that are coupled to each other;
   wherein each primitive logic cell comprises first and second memristive devices that are serially coupled to each other and are of opposite polarities;
   wherein each primitive logic cell has two input ports for receiving two primitive logic cell input signals and two output ports for outputting a primitive logic cell output signal;

wherein the first input port is coupled to a first terminal of the first memristive device, the second input port is coupled to a first terminal of the second memristive device, and wherein the second terminals of the first and second memristive devices are coupled to each other and to the two output ports.

2. The device according to claim 1 further comprising a write circuit that is arranged to set the first and second memristive devices of the multiple primitive logic cells to opposite states during a write phase that precedes a logical operation phase during which the memristive Akers logic array performs a logical operation.

3. The device according to claim 1 further comprising a read circuit that is arranged to read at least one memristive Akers logic array output signal, the at least one memristive Akers logic array output signal is calculated by the memristive Akers logic array during a logical operation phase during which the memristive Akers logic array performs a logical operation.

4. The device according to claim 1 wherein the primitive logic cell output signal is a function of the first and second input signals and of states of the first and second memristive devices.

5. The device according to claim 1 comprising a first group of switches and a second group of switches; wherein the first group of switches couples a write circuit to the two input ports and wherein the second group of switches couples the output port to a read circuit.

6. The device according to claim 5 wherein the first and second groups of switches are transistors.

7. The device according to claim 6 wherein the first and second groups of switches are transistors that are implemented in a silicon layer that is positioned below a metal layer in which the first and second memristive devices of the multiple primitive logic cells are implemented.

8. The device according to claim 1 wherein the memristive Akers logic array is included in a memory unit.

9. The device according to claim 1 wherein the first and second memristive devices of the multiple primitive logic cells are used as memory elements during a storage phase.

10. A method, comprising:
setting states of memristive devices of a memristive Akers logic array during a write phase; wherein the memristive Akers logic array comprises multiple primitive logic cells that are coupled to each other; wherein each primitive logic cell comprises first and second memristive devices that are serially coupled to each other and are of opposite polarities;

wherein each primitive logic cell has two input ports for receiving two primitive logic cell input signals and two output ports for outputting primitive logic cell output signals;

wherein the first input port is coupled to a first terminal of the first memristive device, the second input port is coupled to a first terminal of the second memristive device;

wherein the second terminals of the first and second memristive devices are coupled to each other and to the two output ports; and performing a logical operation by the memristive Akers logic array during a logical operation phase and providing a memristive Akers logic array output signal that is responsive to at least some of the states of the memristive devices and to memristive Akers logic array input signals provided to the memristive Akers logic array during the logical operation phase.

11. The method according to claim 10 further comprising setting, by a write circuit, the first and second memristive devices of the multiple primitive logic cells to opposite states during the write phase.

12. The method according to claim 10 further comprising reading, by a read circuit, at least one memristive Akers logic array output signal, the at least one output signal is the outcome of the logical operation.

13. The method according to claim 10 wherein the primitive logic cell output signals are a function of the first and second primitive logic cell input signals and of states of the first and second memristive devices.

14. The method according to claim 10 comprising coupling, by a first group of switches, a write circuit to the two input ports and coupling, by a second group of switches the primitive logic cell output ports to a read circuit.

15. The method according to claim 14 wherein the first and second groups of switches are transistors.

16. The method according to claim 15 wherein the first and second groups of switches are transistors that are implemented in one or more silicon layers that are positioned below metal layers in which the memristors are implemented in a silicon layer that is positioned below a metal layer in which the first and second memristive devices of the multiple primitive logic cells are implemented.

17. The method according to claim 16 wherein the memristive Akers logic array is included in a memory unit.

18. The method according to claim 16 comprising storing in the first and second memristive devices of the multiple primitive logic cells of the memristive Akers logic array information during a storage phase.

* * * * *